US012660262B2

(12) United States Patent
Chang et al.

(10) Patent No.: US 12,660,262 B2
(45) Date of Patent: Jun. 16, 2026

(54) SEMICONDUCTOR DEVICE AND METHODS OF FORMATION

(71) Applicant: Taiwan Semiconductor Manufacturing Company, Ltd., Hsinchu (TW)

(72) Inventors: Cheng-Wei Chang, Taipei City (TW); Shahaji B. More, Hsinchu City (TW); Chi-Yu Chou, Zhubei City (TW); Yueh-Ching Pai, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 787 days.

(21) Appl. No.: 17/804,427

(22) Filed: May 27, 2022

(65) Prior Publication Data

US 2023/0411453 A1 Dec. 21, 2023

(51) Int. Cl.
| | |
|---|---|
| *H10D 62/10* | (2025.01) |
| *H10D 30/01* | (2025.01) |
| *H10D 30/67* | (2025.01) |
| *H10D 84/01* | (2026.01) |
| *H10D 84/03* | (2025.01) |

(52) U.S. Cl.
CPC ......... *H10D 62/118* (2025.01); *H10D 30/031* (2025.01); *H10D 30/6735* (2025.01); *H10D 30/6755* (2025.01); *H10D 30/6757* (2025.01); *H10D 84/0128* (2025.01); *H10D 84/0151* (2025.01); *H10D 84/038* (2025.01)

(58) Field of Classification Search
CPC ...................... H10D 62/121; H10D 30/6735
See application file for complete search history.

(56) References Cited

U.S. PATENT DOCUMENTS

| | | | |
|---|---|---|---|
| 2011/0207283 A1* | 8/2011 | Haukka ............. | H01L 21/02189 |
| | | | 257/E21.477 |
| 2020/0035786 A1* | 1/2020 | Xie ..................... | H10D 30/6744 |
| 2021/0202327 A1 | 7/2021 | Wang et al. | |
| 2021/0376076 A1* | 12/2021 | Su ........................ | H10D 30/014 |
| 2022/0115530 A1* | 4/2022 | Lu ..................... | H10D 30/6757 |
| 2022/0130955 A1* | 4/2022 | Cheng ............... | H10D 84/0158 |
| 2023/0141523 A1* | 5/2023 | Chen .................. | H10D 84/0151 |
| | | | 257/288 |
| 2023/0320056 A1* | 10/2023 | Zhou .................. | H10D 84/0167 |
| | | | 257/227 |

* cited by examiner

*Primary Examiner* — Erik Kielin
(74) *Attorney, Agent, or Firm* — Harrity & Harrity, LLP

(57) ABSTRACT

Some implementations described herein provide a semiconductor device having an oxide-filled barrier structure between structures of gate-all-around transistors included in the semiconductor device. The use of the oxide-filled barrier structure may reduce a distance separating nanosheet structures of a p-type metal-oxide semiconductor fin structure and an n-type metal-oxide semiconductor fin structure, broaden an availability of work-function metals for gate structures formed around nanochannels of the p-type metal-oxide semiconductor fin structure and n-type metal-oxide semiconductor structure, and improve a performance of the gate-all-around transistors by reducing miller capacitances of the gate-all-around transistors. Furthermore, the oxide-filled barrier structure may enable the combining of the p-type metal-oxide semiconductor fin structure and the n-type metal-oxide semiconductor fin structure to form a type of integrated circuitry, such as an inverter.

20 Claims, 24 Drawing Sheets

200

250

215

245

240

220

235

225

210

230

205

240a
220a
720c
240b
585
205
590a
800

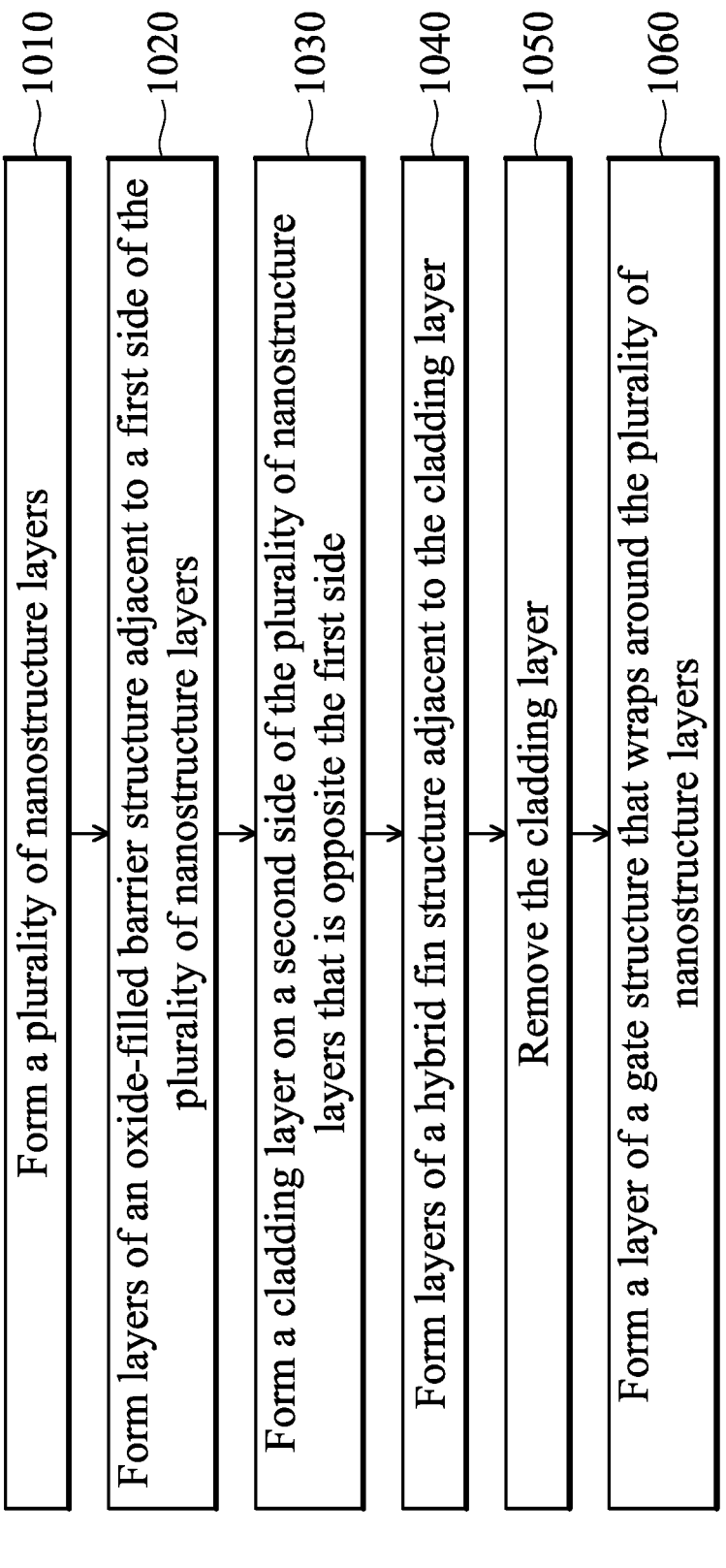

1000

1010 — Form a plurality of nanostructure layers

1020 — Form layers of an oxide-filled barrier structure adjacent to a first side of the plurality of nanostructure layers 1030 — Form a cladding layer on a second side of the plurality of nanostructure layers that is opposite the first side 1040 — Form layers of a hybrid fin structure adjacent to the cladding layer 1050 — Remove the cladding layer 1060 — Form a layer of a gate structure that wraps around the plurality of nanostructure layers

FIG. 10

SEMICONDUCTOR DEVICE AND METHODS OF FORMATION

BACKGROUND

As semiconductor device manufacturing advances and technology processing nodes decrease in size, transistors may become affected by short channel effects (SCEs) such as hot carrier degradation, barrier lowering, and quantum confinement, among other examples. In addition, as the gate length of a transistor is reduced for smaller technology nodes, source/drain (S/D) electron tunneling increases, which increases the off current for the transistor (the current that flows through the channel of the transistor when the transistor is in an off configuration). Silicon (Si)/silicon germanium (SiGe) nanostructure transistors such as nanowires, nanosheets, and gate-all-around (GAA) devices are potential candidates to overcome short channel effects at smaller technology nodes. Nanostructure transistors are efficient structures that may experience reduced SCEs and enhanced carrier mobility relative to other types of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is flowchart of an example process associated with forming a semiconductor device described herein.

DETAILED DESCRIPTION

Figure 1:
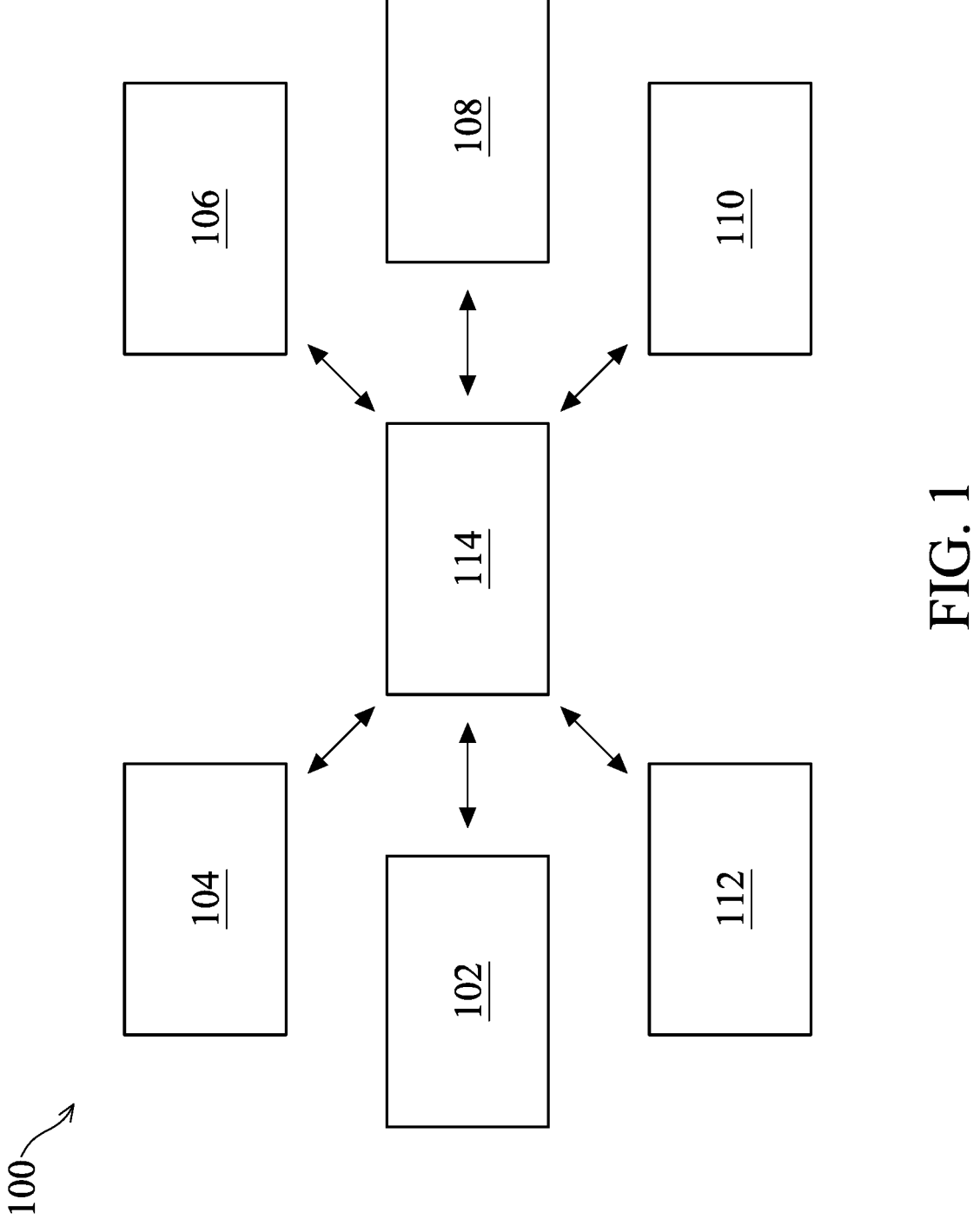
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A gate-all-around (GAA) transistor of a semiconductor device may include a p-type metal oxide semiconductor (PMOS) fin structure or an n-type metal oxide semiconductor (NMOS) fin structure. The PMOS fin structure and the NMOS fin structure may each include nanosheet structures. In some cases, the PMOS fin structure and the NMOS fin structure may be separated by a hybrid fin structure (e.g., a dummy fin structure) over a shallow trench isolation (STI) region.

The use of the hybrid fin structure may constrain design considerations for the semiconductor device. For example, the hybrid fin structure may increase a distance between the nanosheet structures of the PMOS fin structure and the NMOS fin structure to cause an increase in a consumption of valuable space within the semiconductor device. Additionally, the use of the hybrid fin structure may limit a selection of materials for a work-function metal used to form a gate structure as part of the PMOS fin structure and/or the NMOS fin structure. Furthermore, the use of the hybrid fin structure may reduce a performance of a transistor including the PMOS fin structure and/or the NMOS fin structure by increasing a miller capacitance. In some cases, the use of the hybrid fin structure may prohibit a formation of integrated circuitry, such as an inverter, that uses GAA transistors including one or more combinations of the PMOS fin structure and the NMOS fin structure.

Some implementations described herein provide a semiconductor device having an oxide-filled barrier structure between structures of GAA transistors included in the semiconductor device. The use of the oxide-filled barrier structure may reduce a distance separating nanosheet structures of a PMOS fin structure and an NMOS fin structure, broaden an availability of work-function metals for gate structures formed around nanochannels of the PMOS fin structure and NMOS structure, and improve a performance of the GAA transistors by reducing miller capacitances of the GAA transistors. Furthermore, the oxide-filled barrier structure may enable the combining of the PMOS fin structure and the NMOS fin structure to form a type of integrated circuitry, such as an inverter.

In this way, design considerations for the semiconductor device including the oxide-filled barrier structure between nanostructures of the PMOS fin structure and the NMOS fin structure may be broadened. Furthermore, a cost of the semiconductor device may be reduced, a performance of the semiconductor device may be increased, and/or integrated circuitry including a combination of the PMOS fin structure and the NMOS fin structure may be formed.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manu-facturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epi-taxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semicon-ductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unex-posed portions of a photoresist layer through the use of a chemical developer.

The etch tool 108 is a semiconductor processing tool that is capable of etching various types of materials of a sub-strate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions. In some implementations, the etch tool 108 includes a plasma-based asher to remove a photoresist material.

The planarization tool 110 is a semiconductor processing tool that is capable of polishing or planarizing various layers of a wafer or semiconductor device. For example, a planar-ization tool 110 may include a chemical mechanical planar-ization (CMP) tool and/or another type of planarization tool that polishes or planarizes a layer or surface of deposited or plated material. The planarization tool 110 may polish or planarize a surface of a semiconductor device with a com-bination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport sub-strates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a process-ing chamber and a buffer area, to transport substrates and/or semiconductor devices between a processing chamber and an interface tool such as an equipment front end module (EFEM), and/or to transport substrates and/or semiconduc-tor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

As described in connection with FIGS. 2-10 and elsewhere herein, the semiconductor processing tools 102-112 may perform a combination of operations to form one or more portions of a nanostructure transistor. An example combination of operations may include forming a plurality of nanostructure layers. In some implementations, the plurality of nanostructure layers are formed over a semiconductor substrate and are arranged along a direction that is perpendicular to the semiconductor substrate. The combination of operations includes forming layers of an oxide-filled barrier structure adjacent to a first side of the plurality of nanostructure layers, forming a cladding layer on a second side of the plurality of nanostructure layers that is opposite the first side, and forming layers of a hybrid fin structure adjacent to the cladding layer. The combination of operations further includes removing the cladding layer. In some implementations, removing the cladding layer includes removing a plurality of sacrificial layers between the plurality of nanostructure layers. The combination of operations also includes forming a gate structure that wraps around the plurality of nanostructure layers.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
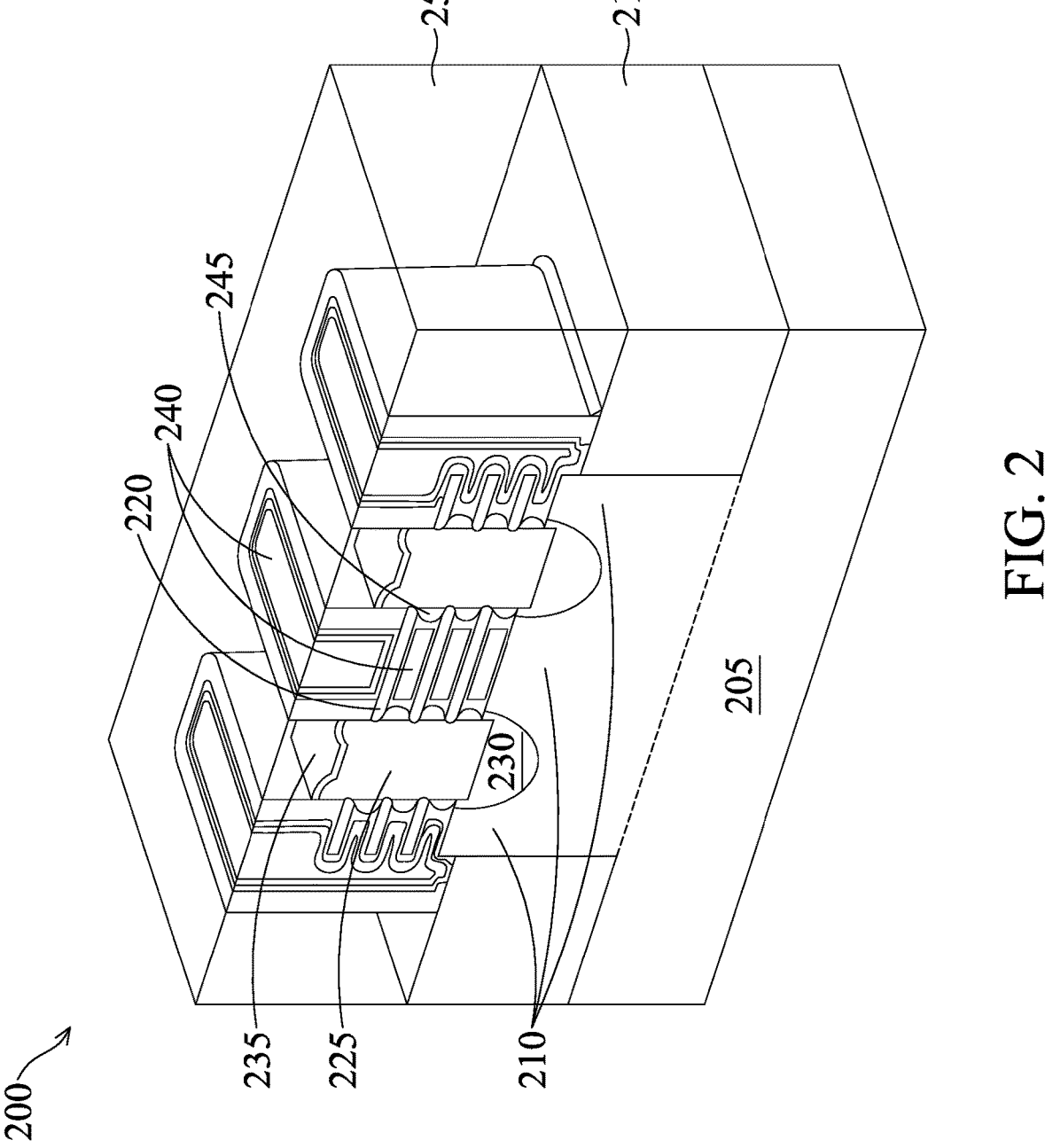
FIG. 2 is a diagram of an example semiconductor device described herein.

FIG. 2 is a diagram of an example semiconductor device 200 described herein. The semiconductor device 200 includes one or more transistors. The one or more transistors may include nanostructure transistor(s) such as nanowire transistors, nanosheet transistors, gate-all-around (GAA) transistors, multi-bridge channel transistors, nanoribbon transistors, and/or other types of nanostructure transistors. The semiconductor device 200 may include one or more additional devices, structures, and/or layers not shown in FIG. 2. For example, the semiconductor device 200 may include additional layers and/or dies formed on layers above and/or below the portion of the semiconductor device 200 shown in FIG. 2. Additionally, or alternatively, one or more additional semiconductor structures and/or semiconductor devices may be formed in a same layer of an electronic device or integrated circuit (IC) that includes the semiconductor device as the semiconductor device 200 shown in FIG. 2. FIGS. 3A-8B are schematic cross-sectional views of various portions of the semiconductor device 200 illustrated in FIG. 2, and correspond to various processing stages of forming nanostructure transistors of the semiconductor device 200.

The semiconductor device 200 includes a semiconductor substrate 205. The semiconductor substrate 205 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate. The semiconductor substrate 205 may include various layers, including conductive or insulating layers formed on a semiconductor substrate. The semiconductor substrate 205 may include a compound semiconductor and/or an alloy semiconductor. The semiconductor substrate 205 may include various doping configurations to satisfy one or more design parameters. For example, different doping profiles (e.g., n-wells, p-wells) may be formed on the semiconductor substrate 205 in regions designed for different device types (e.g., p-type metal-oxide semiconductor (PMOS) nanostructure transistors, n-type metal-oxide semiconductor (NMOS) nanostructure transistors). The suitable doping may include ion implantation of dopants and/or diffusion processes. Further, the semiconductor substrate 205 may include an epitaxial layer (epi-layer), may be strained for performance enhancement, and/or may have other suitable enhancement features. The semiconductor substrate 205 may include a portion of a semiconductor wafer on which other semiconductor devices are formed.

Mesa regions 210 are included above (and/or extend above) the semiconductor substrate 205. A mesa region 210 provides a structure on which nanostructures of the semiconductor device 200 are formed, such as nanostructure channels, nanostructure gate portions that wrap around each of the nanostructure channels, and/or sacrificial nanostructures, among other examples. In some implementations, one or more mesa regions 210 are formed in and/or from a fin structure (e.g., a silicon fin structure) that is formed in the semiconductor substrate 205. The mesa regions 210 may include the same material as the semiconductor substrate 205 and are formed from the semiconductor substrate 205. In some implementations, the mesa regions 210 are doped to form different types of nanostructure transistors, such as p-type nanostructure transistors and/or n-type nanostructure transistors. In some implementations, the mesa regions 210 include silicon (Si) materials or another elementary semiconductor material such as germanium (Ge). In some implementations, the mesa regions 210 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof.

The mesa regions 210 are fabricated by suitable semiconductor process techniques, such as masking, photolithography, and/or etch processes, among other examples. As an example, fin structures may be formed by etching a portion of the semiconductor substrate 205 away to form recesses in the semiconductor substrate 205. The recesses may then be filled with isolating material that is recessed or etched back to form shallow trench isolation (STI) regions 215 above the semiconductor substrate 205 and between the fin structures. Source/drain recesses may be formed in the fin structures, which results in formation of the mesa regions 210 between the source/drain recesses. However, other fabrication techniques for the STI regions 215 and/or for the mesa regions 210 may be used.

The STI regions 215 may electrically isolate adjacent fin structures and may provide a layer on which other layers and/or structures of the semiconductor device 200 are formed. The STI regions 215 may include a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. The STI regions 215 may include a multi-layer structure, for example, having one or more liner layers.

The semiconductor device 200 includes a plurality of nanostructure channels 220 that extend between, and are electrically coupled with, source/drain regions 225. The nanostructure channels 220 are arranged in a direction that is approximately perpendicular to the semiconductor substrate 205. In other words, the nanostructure channels 220 are vertically arranged or stacked above the semiconductor substrate 205.

The nanostructure channels 220 include silicon-based nanostructures (e.g., nanosheets or nanowires, among other examples) that function as the semiconductive channels of the nanostructure transistor(s) of the semiconductor device 200. In some implementations, the nanostructure channels 220 may include silicon germanium (SiGe) or another silicon-based material. The source/drain regions 225 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the semiconductor device 200 may include p-type metal-oxide semiconductor (PMOS) nanostructure transistors that include p-type source/drain regions 225, n-type metal-oxide semiconductor (NMOS) nanostructure transistors that include n-type source/drain regions 225, and/or other types of nanostructure transistors.

In some implementations, a buffer region 230 is included under a source/drain region 225 between the source/drain region 225 and a fin structure above the semiconductor substrate 205. A buffer region 230 may provide isolation between a source/drain region 225 and adjacent mesa regions 210. A buffer region 230 may be included to reduce, minimize, and/or prevent electrons from traversing into the mesa regions 210 (e.g., instead of through the nanostructure channels 220, thereby reducing current leakage), and/or may be included to reduce, minimize and/or prevent dopants from the source/drain region 225 into the mesa regions 210 (which reduces short channel effects).

A capping layer 235 may be included over and/or on the source/drain region 225. The capping layer 235 may include silicon, silicon germanium, doped silicon, doped silicon germanium, and/or another material. The capping layer 235 may be included to reduce dopant diffusion and to protect the source/drain regions 225 in semiconductor processing operations for the semiconductor device 200 prior to contact formation. Moreover, the capping layer 235 may contribute to metal-semiconductor (e.g., silicide) alloy formation.

At least a subset of the nanostructure channels 220 extend through one or more gate structures 240. The gate structures 240 may be formed of one or more metal materials, one or more high dielectric constant (high-k) materials, and/or one or more other types of materials. In some implementations, dummy gate structures (e.g., polysilicon (PO) gate structures or another type of gate structures) are formed in the place of (e.g., prior to formation of) the gate structures 240 so that one or more other layers and/or structures of the semiconductor device 200 may be formed prior to formation of the gate structures 240. This reduces and/or prevents damage to the gate structures 240 that would otherwise be caused by the formation of the one or more layers and/or structures. A replacement gate process (RGP) is then performed to remove the dummy gate structures and replace the dummy gate structures with the gate structures 240 (e.g., replacement gate structures).

As further shown in FIG. 2, portions of a gate structure 240 are formed in between pairs of nanostructure channels 220 in an alternating vertical arrangement. In other words, the semiconductor device 200 includes one or more vertical stacks of alternating nanostructure channels 220 and portions of a gate structure 240, as shown in FIG. 2. In this way, a gate structure 240 wraps around an associated nanostructure channel 220 on all sides of the nanostructure channel 220 which increases control of the nanostructure channel 220, increases drive current for the nanostructure transistor(s) of the semiconductor device 200, and reduces short channel effects (SCEs) for the nanostructure transistor(s) of the semiconductor device 200.

Some source/drain regions 225 and gate structures 240 may be shared between two or more nanoscale transistors of the semiconductor device 200. In these implementations, one or more source/drain regions 225 and a gate structure 240 may be connected or coupled to a plurality of nanostructure channels 220, as shown in the example in FIG. 2. This enables the plurality of nanostructure channels 220 to be controlled by a single gate structure 240 and a pair of source/drain regions 225.

Inner spacers (InSP) 245 may be included between a source/drain region 225 and an adjacent gate structure 240. In particular, inner spacers 245 may be included between a source/drain region 225 and portions of a gate structure 240 that wrap around a plurality of nanostructure channels 220. The inner spacers 245 are included on ends of the portions of the gate structure 240 that wrap around the plurality of nanostructure channels 220. The inner spacers 245 are included in cavities that are formed in between end portions of adjacent nanostructure channels 220. The inner spacers 245 are included to reduce parasitic capacitance and to protect the source/drain regions 225 from being etched in a nanosheet release operation to remove sacrificial nanosheets between the nanostructure channels 220. The inner spacers 245 include a silicon nitride ($Si_xN_y$) material, a silicon oxide ($SiO_x$) material, a silicon oxynitride (SiON) material, a silicon oxycarbide (SiOC) material, a silicon carbon nitride (SiCN) material, a silicon oxycarbonnitride (SiOCN) material, and/or another dielectric material.

In some implementations, the semiconductor device 200 includes hybrid fin structures (not shown). The hybrid fin structures may also be referred to as dummy fins, H-fins, or non-active fins, among other examples. Hybrid fin structures may be included between adjacent source/drain regions 225, between portions of a gate structure 240, and/or between adjacent stacks of nanostructure channels 220, among other examples. The hybrid fins extend in a direction that is approximately perpendicular to the gate structures 240.

Hybrid fin structures are configured to provide electrical isolation between two or more structures and/or components included in the semiconductor device 200. In some implementations, a hybrid fin structure is configured to provide electrical isolation between two or more stacks of nanostructure channels 220. In some implementations, a hybrid fin structure is configured to provide electrical isolation between two or more source/drain regions 225. In some implementations, a hybrid fin structure is configured to provide electrical isolation between two or more gates structures or two or more portions of a gate structure. In some implementations, a hybrid fin structure is configured to provide electrical isolation between a source/drain region 225 and a gate structure 240.

A hybrid fin structure may include a plurality of types of dielectric materials. A hybrid fin structure may include a combination of one or more low dielectric constant (low-k) dielectric materials (e.g., a silicon oxide ($SiO_x$) and/or a silicon nitride ($Si_xN_y$), among other examples) and one or more high dielectric constant (high-k) dielectric materials (e.g., a hafnium oxide ($HfO_x$) and/or other high-k dielectric material).

The semiconductor device 200 may also include an inter-layer dielectric (ILD) layer 250 above the STI regions 215. The ILD layer 250 may be referred to as an ILD0 layer. The ILD layer 250 surrounds the gate structures 240 to provide electrical isolation and/or insulation between the gate structures 240 and/or the source/drain regions 225, among other examples. Conductive structures such as contacts and/or interconnects may be formed through the ILD layer 250 to the source/drain regions 225 and the gate structures 240 to provide control of the source/drain regions 225 and the gate structures 240.

As described in connection with FIGS. 3A-10 and elsewhere herein, the semiconductor device 200 may be formed to include features corresponding to one or more portions of nanostructure transistors. For example, the semiconductor device 200 may include a p-type metal-oxide semiconductor (PMOS) nanostructure transistor including a first plurality of the nanostructure channels 220 over the semiconductor substrate 205. In some implementations, the first plurality of nanostructure channels 220 are arranged in a direction that is perpendicular to the semiconductor substrate 205. The PMOS nanostructure transistor includes a first gate structure (e.g., of the gate structures 240) wrapping around each of the first plurality of nanostructure channels 220. The semiconductor device 200 also includes an n-type metal-oxide semiconductor (NMOS) nanostructure transistor including a second plurality of nanostructure channels 220 over the semiconductor substrate 205. In some implementations, the second plurality of nanostructure channels 220 are arranged in a direction that is perpendicular to the semiconductor substrate 205. The NMOS nanostructure transistor includes a second gate structure (e.g., of the gate structures 240) wrapping around each of the second plurality of nanostructure channels 220. The semiconductor device 200 further includes an oxide-filled barrier structure between the first plurality of nanostructure channels 220 and the second plurality of nanostructure channels 220. In some implementations, the oxide-filled barrier structure includes a crystalline silicon-dioxide material lined with a dielectric material.

Additionally, or alternatively, the semiconductor device 200 may include a plurality of channel layers (e.g., a plurality of the nanostructure channels 220) over the semiconductor substrate 205. In some implementations, the plurality of channel layers are arranged in a direction that is perpendicular to the semiconductor substrate 205. The semiconductor device 200 includes a gate structure (e.g., of the gate structures 240) wrapping around each of the plurality of channel layers. The semiconductor device 200 includes a hybrid fin structure adjacent to a first side of the channel layers and an oxide-filled barrier structure adjacent to a second side of the plurality of channel layers that is opposite the first side.

As indicated above, FIG. 2 is provided as an example. Other examples may differ from what is described with regard to FIG. 2.

Figure 3A:
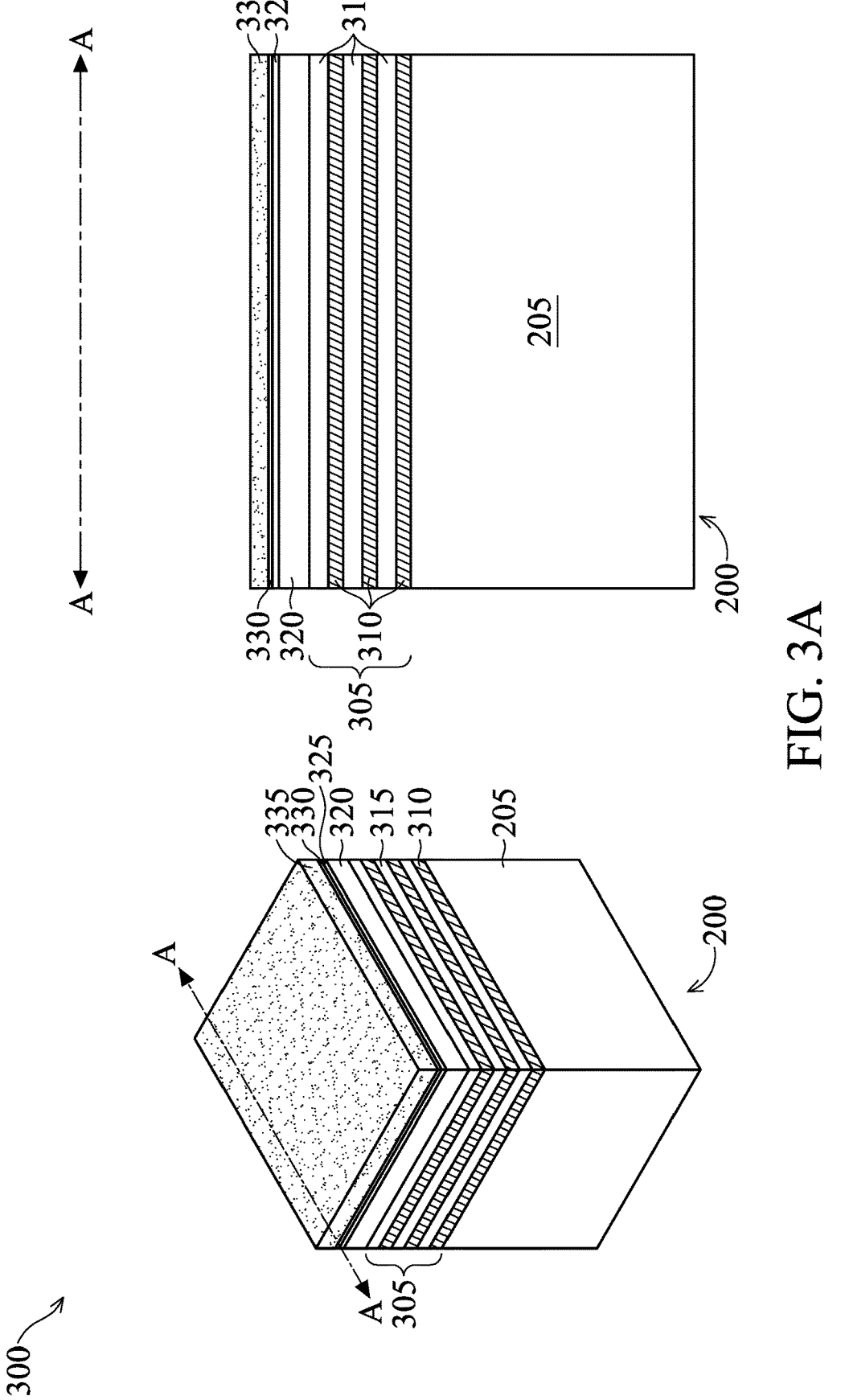
FIGS. 3A and 3B are diagrams of an example implementation of a fin formation process described herein.
Figure 3B:
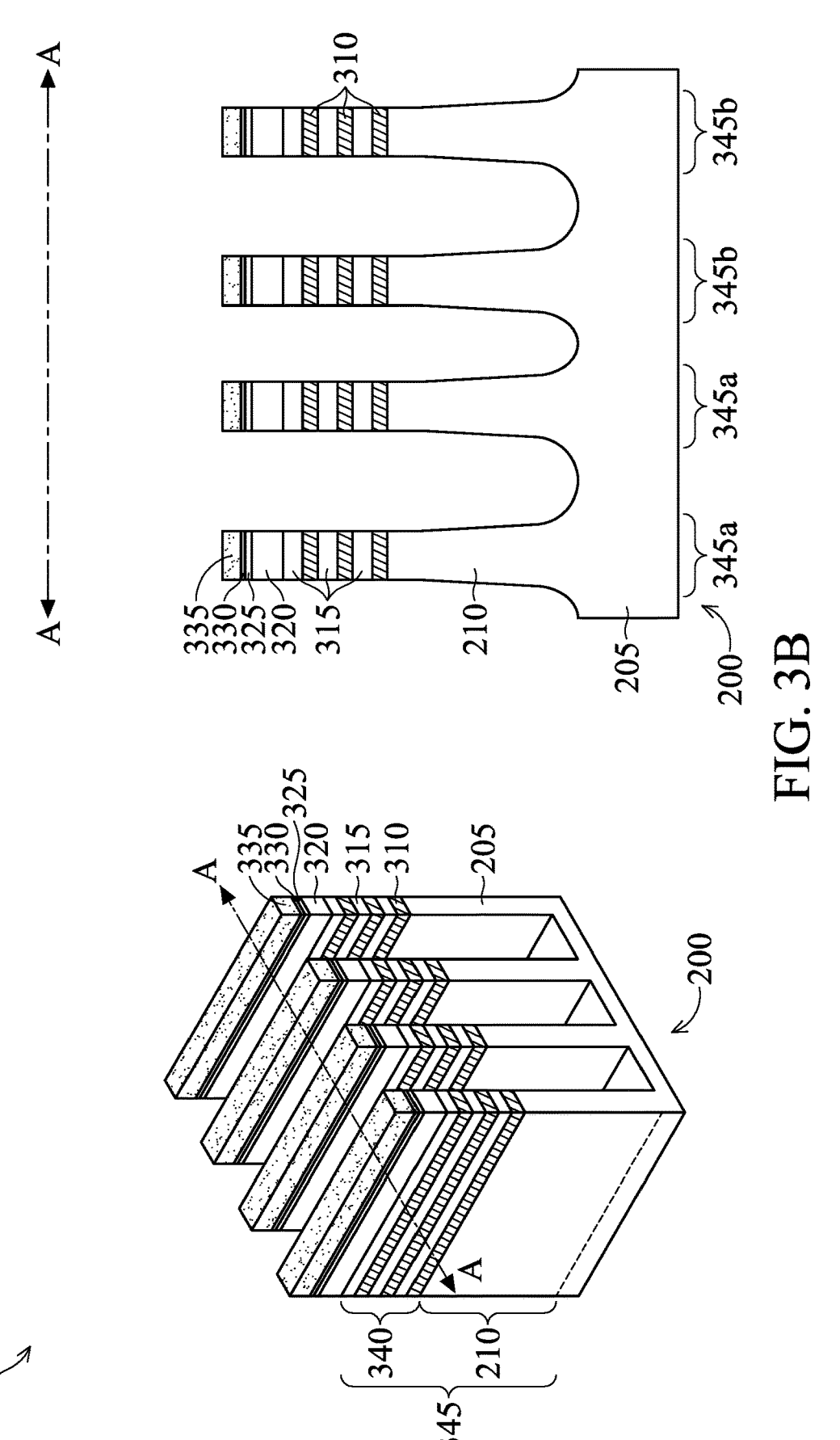

FIGS. 3A and 3B are diagrams of an example implementation 300 of a fin formation process described herein. The example implementation 300 includes an example of forming fin structures for the semiconductor device 200 or a portion thereof. The semiconductor device 200 may include one or more additional devices, structures, and/or layers not shown in FIGS. 3A and 3B. The semiconductor device 200 may include additional layers and/or dies formed on layers above and/or below the portion of the semiconductor device 200 shown in FIGS. 3A and 3B. Additionally, or alternatively, one or more additional semiconductor structures and/or semiconductor devices may be formed in a same layer of an electronic device that includes the semiconductor device 200.

FIG. 3A illustrates a perspective view of the semiconductor device 200 and a cross-sectional view along the line A-A in the perspective view. As shown in FIG. 3A, processing of the semiconductor device 200 is performed in connection with the semiconductor substrate 205. A layer stack 305 is formed on the semiconductor substrate 205. The layer stack 305 may be referred to as a superlattice. In some implementations, one or more operations to form are performed in connection with the semiconductor substrate 205 prior to formation of the layer stack 305. For example, an anti-punch through (APT) implant operation may be performed. The APT implant operation may be performed in one or more regions of the semiconductor substrate 205 above which the nanostructure channels 220 are to be formed. The APT implant operation is performed, for example, to reduce and/or prevent punch-through or unwanted diffusion into the semiconductor substrate 205.

The layer stack 305 includes a plurality of alternating layers that are arranged in a direction that is approximately perpendicular to the semiconductor substrate 205. For example, the layer stack 305 includes vertically alternating layers of first layers 310 and second layers 315 above the semiconductor substrate 205. The quantity of the first layers 310 and the quantity of the second layers 315 illustrated in FIG. 3A are examples, and other quantities of the first layers 310 and the second layers 315 are within the scope of the present disclosure. In some implementations, the first layers 310 and the second layers 315 are formed to different thicknesses. For example, the second layers 315 may be formed to a thickness that is greater relative to a thickness of the first layers 310. In some implementations, the first layers 310 (or a subset thereof) are formed to a thickness in a range of approximately 4 nanometers to approximately 7 nanometers. In some implementations, the second layers 315 (or a subset thereof) are formed to a thickness in a range of approximately 8 nanometers to approximately 12 nanometers. However, other values for the thickness of the first layers 310 and for the thickness of the second layers 315 are within the scope of the present disclosure.

The first layers 310 include a first material composition, and the second layers 315 include a second material composition. In some implementations, the first material composition and the second material composition are the same material composition. In some implementations, the first material composition and the second material composition are different material compositions. As an example, the first layers 310 may include silicon germanium (SiGe) and the second layers 315 may include silicon (Si). In some implementations, the first material composition and the second material composition have different oxidation rates and/or etch selectivity.

As described herein, the second layers 315 may be processed to form the nanostructure channel 220 for subsequently-formed nanostructure transistors of the semiconductor device 200. The first layers 310 are sacrificial nanostructures that are eventually removed and serve to define a vertical distance between adjacent nanostructure channels 220 for a subsequently-formed gate structure 240 of the semiconductor device 200. Accordingly, the first layers 310 are referred to as sacrificial layers and the second layers 315 may be referred to as channel layers.

The deposition tool 102 deposits and/or grows the alternating layers of the layer stack 305 to include nanostructures (e.g., nanosheets) on the semiconductor substrate 205. For example, the deposition tool 102 grows the alternating layers by epitaxial growth. However, other processes may be used to form the alternating layers of the layer stack 305. Epitaxial growth of the alternating layers of the layer stack 305 may be performed by a molecular beam epitaxy (MBE) process, a metalorganic chemical vapor deposition (MOCVD) process, and/or another suitable epitaxial growth process. In some implementations, the epitaxially grown layers such as the second layers 315 include the same material as the material of the semiconductor substrate 205. In some implementations, the first layers 310 and/or the second layers 315 include a material that is different from the material of the semiconductor substrate 205. As described above, in some implementations, the first layers 310 include epitaxially grown silicon germanium (SiGe) layers and the second layers 315 include epitaxially grown silicon (Si) layers. Alternatively, the first layers 310 and/or the second layers 315 may include other materials such as germanium (Ge), a compound semiconductor material such as silicon carbide (SiC), gallium arsenide (GaAs), gallium phosphide (GaP), indium phosphide (InP), indium arsenide (InAs), indium antimonide (InSb), an alloy semiconductor such as silicon germanium (SiGe), gallium arsenide phosphide (GaAsP), aluminum indium arsenide (AlInAs), aluminum gallium arsenide (AlGaAs), indium gallium arsenide (InGaAs), gallium indium phosphide (GaInP), gallium indium arsenide phosphide (GaInAsP), and/or a combination thereof. The material(s) of the first layers 310 and/or the material(s) of the second layers 315 may be chosen based on providing different oxidation properties, different etching selectivity properties, and/or other different properties.

As further shown in FIG. 3A, the deposition tool 102 may form one or more additional layers over and/or on the layer stack 305. For example, a hard mask (HM) layer 320 may be formed over and/or on the layer stack 305 (e.g., on the top-most second layer 315 of the layer stack 305). As another example, a capping layer 325 may be formed over and/or on the hard mask layer 320. As another example, another hard mask layer including an oxide layer 330 and a nitride layer 335 may be formed over and/or on the capping layer 325. The one or more hard mask (HM) layers 320, 325, and 330 may be used to form one or more structures of the semiconductor device 200. The oxide layer 330 may function as an adhesion layer between the layer stack 305 and the nitride layer 335, and may act as an etch stop layer for etching the nitride layer 335. The one or more hard mask layers 320, 325, and 330 may include silicon germanium (SiGe), a silicon nitride (Si$_x$N$_y$), a silicon oxide (SiO$_x$), and/or another material. The capping layer 325 may include silicon (Si) and/or another material. In some implementations, the capping layer 325 is formed of the same material as the semiconductor substrate 205. In some implementations, the one or more additional layers are thermally grown, deposited by CVD, PVD, ALD, and/or are formed using another deposition technique.

FIG. 3B illustrates a perspective view of the semiconductor device 200 and a cross-sectional view along the line A-A. As shown in FIG. 3B, the layer stack 305 and the semiconductor substrate 205 are etched to remove portions of the layer stack 305 and portions of the semiconductor substrate 205. The portions 340 of the layer stack 305, and mesa portions (also referred to as mesa regions 210), remaining after the etch operation are referred to a fin structures 345 above the semiconductor substrate 205 of the semiconductor device 200. A fin structure 345 includes a portion 340 of the layer stack 305 over and/or on a mesa region 210 formed in and/or above the semiconductor substrate 205. The fin structures 345 may be formed by any suitable semiconductor processing technique. For example, the deposition tool 102, the exposure tool 104, the developer tool 106, and/or the etch tool 108 may form the fin structures 345 using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fin structures.

In some implementations, the deposition tool 102 forms a photoresist layer over and/or on the hard mask layer including the oxide layer 330 and the nitride layer 335, the exposure tool 104 exposes the photoresist layer to radiation (e.g., deep ultraviolet (UV) radiation, extreme UV (EUV) radiation), a post-exposure bake process is performed (e.g., to remove residual solvents from the photoresist layer), and the developer tool 106 develops the photoresist layer to form a masking element (or pattern) in the photoresist layer. In some implementations, patterning the photoresist layer to form the masking element is performed using an electron beam (e-beam) lithography process. The masking element may then be used to protect portions of the semiconductor substrate 205 and portions the layer stack 305 in an etch operation such that the portions of the semiconductor substrate 205 and portions the layer stack 305 remain non-etched to form the fin structures 345. Unprotected portions of the substrate and unprotected portions of the layer stack 305 are etched (e.g., by the etch tool 108) to form trenches in the semiconductor substrate 205. The etch tool may etch the unprotected portions of the substrate and unprotected portions of the layer stack 305 using a dry etch technique (e.g., reactive ion etching), a wet etch technique, and/or a combination thereof.

In some implementations, another fin formation technique is used to form the fin structures 345. For example, a fin region may be defined (e.g., by mask or isolation regions), and the portions 340 may be epitaxially grown in the form of the fin structures 345. In some implementations, forming the fin structures 345 includes a trim process to decrease the width of the fin structures 345. The trim process may include wet and/or dry etching processes, among other examples.

As further shown in FIG. 3B, fin structures 345 may be formed for different types of nanostructure transistors for the semiconductor device 200. In particular, a first subset of fin structures 345a may be formed for p-type nanostructure transistors (e.g., p-type metal oxide semiconductor (PMOS) nanostructure transistors), and a second subset of fin structures 345b may be formed for n-type nanostructure transistors (e.g., n-type metal oxide semiconductor (NMOS) nanostructure transistors). The second subset of fin structures 345b may be doped with a p-type dopant (e.g., boron (B) and/or germanium (Ge), among other examples) and the first subset of fin structures 345a may be doped with an n-type dopant (e.g., phosphorous (P) and/or arsenic (As), among other examples). Additionally, or alternatively, p-type source/drain regions 225 may be subsequently formed for the p-type nanostructure transistors that include the first subset of fin structures 345a, and n-type source/drain regions 225 may be subsequently formed for the n-type nanostructure transistors that include the second subset of fin structures 345b.

The first subset of fin structures 345a (e.g., PMOS fin structures) and the second subset of fin structures 345b (e.g., NMOS fin structures) may be formed to include similar properties and/or different properties. For example, the first subset of fin structures 345a may be formed to a first height and the second subset of fin structures 345b may be formed to a second height, where the first height and the second height are different heights. As another example, the first subset of fin structures 345a may be formed to a first width and the second subset of fin structures 345b may be formed to a second width, where the first width and the second width are different widths. In the example shown in FIG. 3B, the second width of the second subset of fin structures 345b (e.g., for the NMOS nanostructure transistors) is greater relative to the first width of the first subset of fin structures 345b (e.g., for the PMOS nanostructure transistors). However, other examples are within the scope of the present disclosure.

As indicated above, FIGS. 3A and 3B are provided as an example. Other examples may differ from what is described with regard to FIGS. 3A and 3B. Example implementation 300 may include additional operations, fewer operations, different operations, and/or a different order of operations than those described in connection with FIGS. 3A and 3B.

Figure 4A:
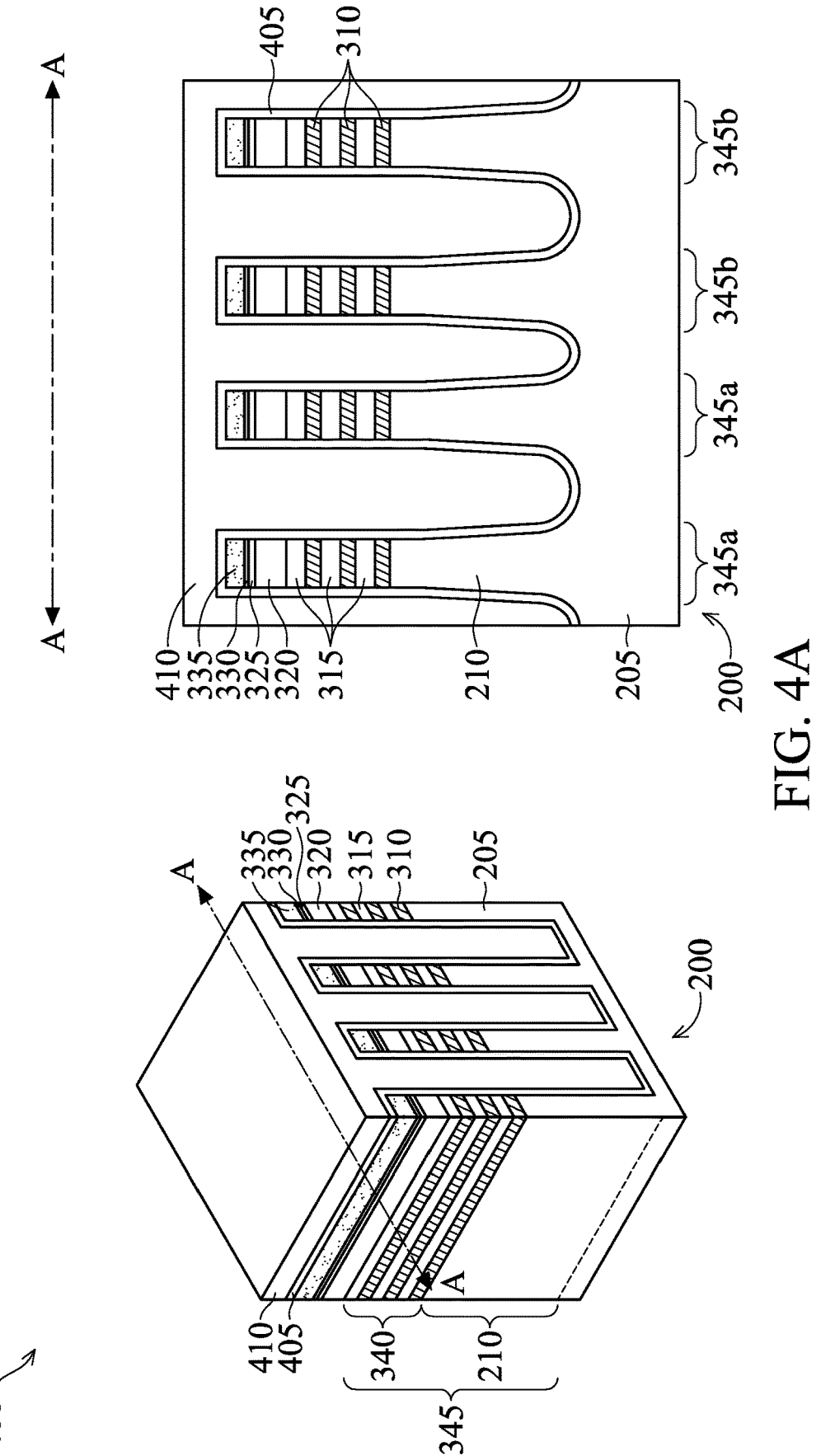
FIGS. 4A and 4B are diagrams of an example implementation of a shallow trench isolation (STI) process described herein.
Figure 4B:
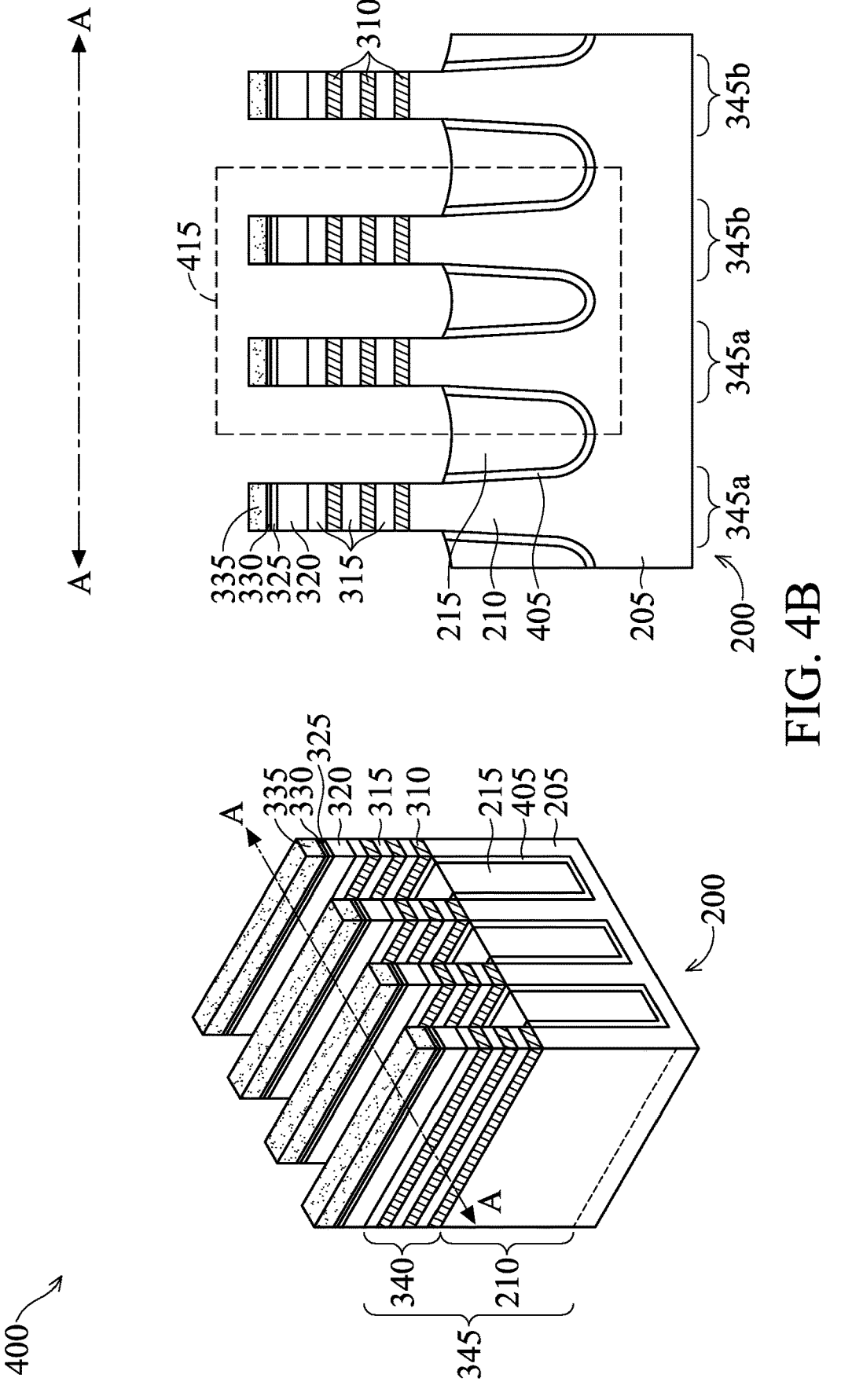

FIGS. 4A and 4B are diagrams of an example implementation 400 of an STI formation process described herein. The example implementation 400 includes an example of forming STI regions 215 between the fin structures 345 for the semiconductor device 200 or a portion thereof. The semiconductor device 200 may include one or more additional devices, structures, and/or layers not shown in FIGS. 3A and 3B. The semiconductor device 200 may include additional layers and/or dies formed on layers above and/or below the portion of the semiconductor device 200 shown in FIGS. 4A and 4B. Additionally, or alternatively, one or more additional semiconductor structures and/or semiconductor devices may be formed in a same layer of an electronic device that includes the semiconductor device 200. In some implementations, the operations described in connection with the example implementation 400 are performed after the processes described in connection with FIGS. 3A and 3B.

FIG. 4A illustrates a perspective view of the semiconductor device 200 and a cross-sectional view along the line A-A. As shown in FIG. 4A, a liner 405 and a dielectric layer 410 are formed above the semiconductor substrate 205 and interposing (e.g., in between) the fin structures 345. The deposition tool 102 may deposit the liner 405 and the dielectric layer 410 over the semiconductor substrate 205 and in the trenches between the fin structures 345. The deposition tool 102 may form the dielectric layer 410 such that a height of a top surface of the dielectric layer 410 and a height of a top surface of the nitride layer 335 are approximately a same height.

Alternatively, the deposition tool 102 may form the dielectric layer 410 such that the height of the top surface of the dielectric layer 410 is greater relative to the height of the top surface of the nitride layer 335, as shown in FIG. 4A. In this way, the trenches between the fin structures 345 are overfilled with the dielectric layer 410 to ensure the trenches are fully filled with the dielectric layer 410. Subsequently, the planarization tool 110 may perform a planarization or polishing operation (e.g., a CMP operation) to planarize the dielectric layer 410. The nitride layer 335 of the hard mask layer may function as a CMP stop layer in the operation. In other words, the planarization tool 110 planarizes the dielectric layer 410 until reaching the nitride layer 335 of the hard mask layer. Accordingly, a height of top surfaces of the dielectric layer 410 and a height of top surfaces of the nitride layer 335 are approximately equal after the operation.

The deposition tool 102 may deposit the liner 405 using a conformal deposition technique. The deposition tool 102 may deposit the liner 405 using a CVD technique (e.g., a flowable CVD (FCVD) technique or another CVD technique), a PVD technique, an ALD technique, and/or another deposition technique. In some implementations, after deposition of the liner 405, the semiconductor device 200 is annealed, for example, to increase the quality of the liner 405.

The liner 405 and the dielectric layer 410 each includes a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. In some implementations, the dielectric layer 410 may include a multi-layer structure, for example, having one or more liner layers.

FIG. 4B illustrates a perspective view of the semiconductor device 200 and a cross-sectional view along the line A-A. As shown in FIG. 4B, an etch back operation is performed to remove portions of the liner 405 and portions of the dielectric layer 410 to form the STI regions 215. The etch tool 108 may etch the liner 405 and the dielectric layer 410 in the etch back operation to form the STI regions 215. The etch tool 108 etches the liner 405 and the dielectric layer 410 based on the hard mask layer (e.g., the hard mask layer including the oxide layer 330 and the nitride layer 335). The etch tool 108 etches the liner 405 and the dielectric layer 410 such that the height of the STI regions 215 are less than or approximately a same height as the bottom of the portions 340 of the layer stack 305. Accordingly, the portions 340 of the layer stack 305 extend above the STI regions 215. In some implementations, the liner 405 and the dielectric layer 410 are etched such that the heights of the STI regions 215 are less than heights of top surfaces of the mesa regions 210.

In some implementations, the etch tool 108 uses a plasma-based dry etch technique to etch the liner 405 and the dielectric layer 410. Ammonia ($NH_3$), hydrofluoric acid (HF), and/or another etchant may be used. The plasma-based dry etch technique may result in a reaction between the etchant(s) and the material of the liner 405 and the dielectric layer 410, including:

$$SiO_2 + 4HF \rightarrow SiF_4 + 2H_2O$$

where silicon dioxide ($SiO_2$) of the liner 405 and the dielectric layer 410 react with hydrofluoric acid to form byproducts including silicon tetrafluoride ($SiF_4$) and water ($H_2O$). The silicon tetrafluoride is further broken down by the hydrofluoric acid and ammonia to form an ammonium fluorosilicate ($(NH_4)_2SiF_6$) byproduct:

$$SiF_4 + 2HF + 2NH_3 \rightarrow (NH_4)_2SiF_6$$

The ammonium fluorosilicate byproduct is removed from a processing chamber of the etch tool 108. After removal of the ammonium fluorosilicate, a post-process temperature in a range of approximately 200 degrees Celsius to approximately 250 degrees Celsius is used to sublimate the ammonium fluorosilicate into constituents of silicon tetrafluoride, ammonia, and hydrofluoric acid.

In some implementations, the etch tool 108 etches the liner 405 and the dielectric layer 410 such that a height of the STI regions 215 between the first subset of fin structures 345a (e.g., for the PMOS nanostructure transistors) is greater relative to a height of the STI regions 215 between the second subset of fin structures 345b (e.g., for the NMOS nanostructure transistors). This primarily occurs due to the greater width the fin structures 345b relative to the width of the fin structures 345a. Moreover, this results in a top surface of an STI region 215 between a fin structure 345a and a fin structure 345b being sloped or slanted (e.g., downward sloped from the fin structure 345a to the fin structure 345b, as shown in the example in FIG. 4B). The etchants used to etch the liner 405 and the dielectric layer 410 first experience physisorption (e.g., a physical bonding to the liner 405 and the dielectric layer 410) as a result of a Van der Waals force between the etchants and the surfaces of the liner 405 and the dielectric layer 410. The etchants become trapped by dipole movement force. The etchants then attach to dangling bonds of the liner 405 and the dielectric layer 410, and chemisorption begins. Here, the chemisorption of the etchant on the surface of the liner 405 and the dielectric layer 410 results in etching of the liner 405 and the dielectric layer 410. The greater width of the trenches between the second subset of fin structures 345b provides a greater surface area for chemisorption to occur, which results in a greater etch rate between the second subset of fin structures 345b. The greater etch rate results in the height of the STI regions 215 between the second subset of fin structures 345b being lesser relative to the height of the STI regions 215 between the first subset of fin structures 345a.

As described in connection FIGS. 5A-10, and elsewhere herein, an oxide-filled barrier structure and hybrid fin structures may be formed in a region 415 that includes the fin structure 345a (e.g., PMOS fin structure) and the fin structure 345b (e.g., the NMOS fin structure).

As indicated above, FIGS. 4A and 4B are provided as an example. Other examples may differ from what is described with regard to FIGS. 4A and 4B. Example implementation 400 may include additional operations, fewer operations, different operations, and/or a different order of operations than those described in connection with FIGS. 4A and 4B.

FIGS. 5A-5I are diagrams of an example implementation 500 of an oxide-filled barrier structure and a hybrid fin structure formation process described herein. The example implementation includes forming the oxide-filled barrier structure between the fin structures 345a and 345b. The example implementation further includes forming one or more hybrid fin structures adjacent to the fin structures 345a and 345b.

Figure 5A:
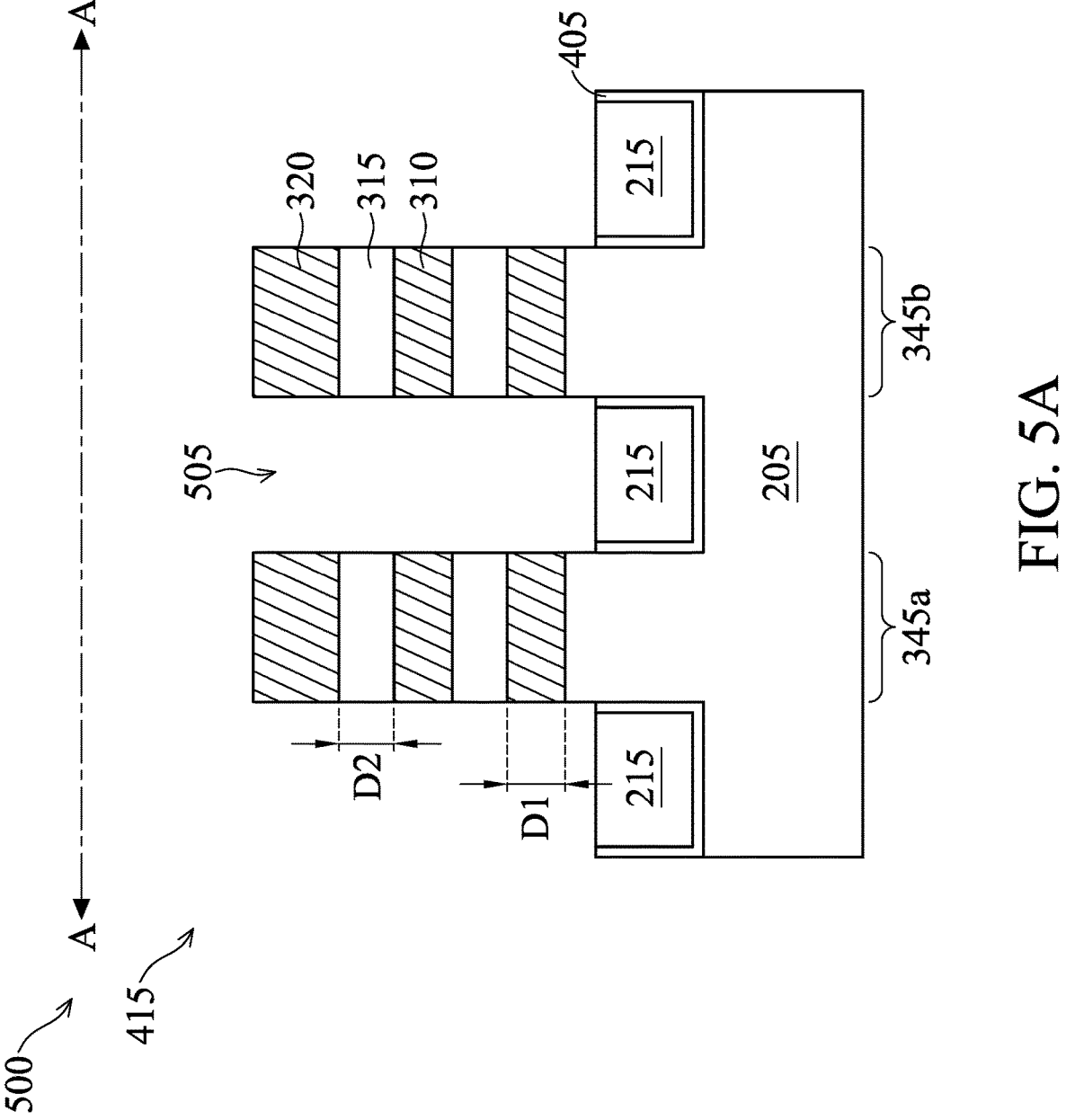
FIGS. 5A-5I are diagrams of an example implementation of an oxide-filled barrier structure and a hybrid fin structure formation process described herein.

FIG. 5A illustrates a cross-sectional view of the region 415 along the line A-A. As shown in FIG. 5A, the region 415 includes a plurality of recesses 505 over the STI regions 215 formed in the semiconductor substrate 205. Also, as shown in FIG. 5A, the fin structure 345a (e.g., a PMOS fin structure) and the fin structure 345b (e.g., an NMOS fin structure) each includes the first layers 310, the second layers 315, and the hard mask layer 320.

In the implementation 500, the first layers 310 include a thickness D1 and the second layers 315 include a thickness D2. For example, the thickness D1 may be included in a range of approximately 10 nanometers to approximately 30 nanometers. Additionally, or alternatively, the thickness D2 may be included in a range of approximately 10 nanometers to approximately 30 nanometers. However other values and ranges for the thicknesses D1 and D2 are within the scope of the present disclosure.

Figure 5B:
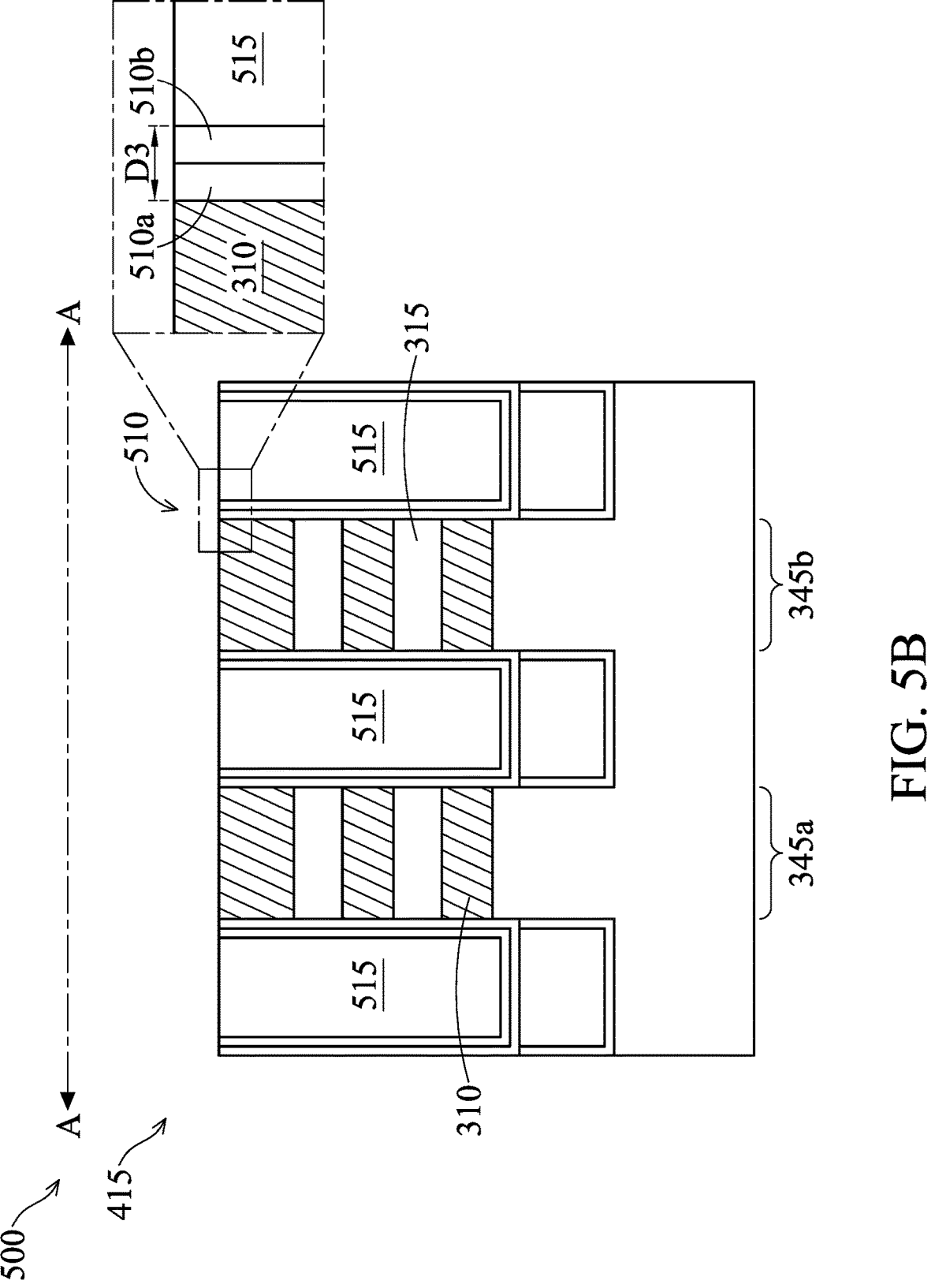

FIG. 5B illustrates a cross-sectional view of the region 415 along the line A-A. As shown in FIG. 5B, one or more of the semiconductor processing tools 102-112, such as the deposition tool 102, have formed one or more layers of a material (e.g., layers of an oxide-filled barrier structure) within the recesses 505.

For example, the deposition tool 102 may deposit a liner layer 510 along a contour of the recesses 505 (e.g., along a sidewall of the fin structures 345a and 345b, including the first layers 310 and the second layers 315). In some implementations, the liner layer 510 includes multiple layers, including a first layer 510a of a silicon dioxide (SiO2) material and a second layer 510b of a silicon oxycarbonnitride (SiOCN) material, among other examples. The deposition tool 102 may deposit the liner layer 510 using a CVD technique, a PVD technique, an ALD technique, and/or another deposition technique.

The liner layer 510 may include a surface that is a distance D3 from a sidewall of one or more of the fin structures 345. As an example, the distance D3 may be included in a range of approximately 3 nanometers to approximately 10 nanometers. If the distance D3 is less than approximately 3 nanometers, extrusions from the first layers 310 and/or the second layers 315 may be present. If the distance D3 is greater than approximately 10 nanometers, deposition defects (e.g., peeling of the liner layer 510 from the sidewall) may be present. However, other values and ranges for the distance D3 are within the scope of the present disclosure.

Additionally, the deposition tool 102 may deposit an isolation layer 515 over the liner layer 510. In some implementations, the isolation layer 515 includes a crystalline silicon-dioxide (c-SiO2) material. among other examples. The deposition tool 102 may deposit the isolation layer 515 using a CVD technique, a PVD technique, an ALD technique, and/or another deposition technique.

Figure 5C:
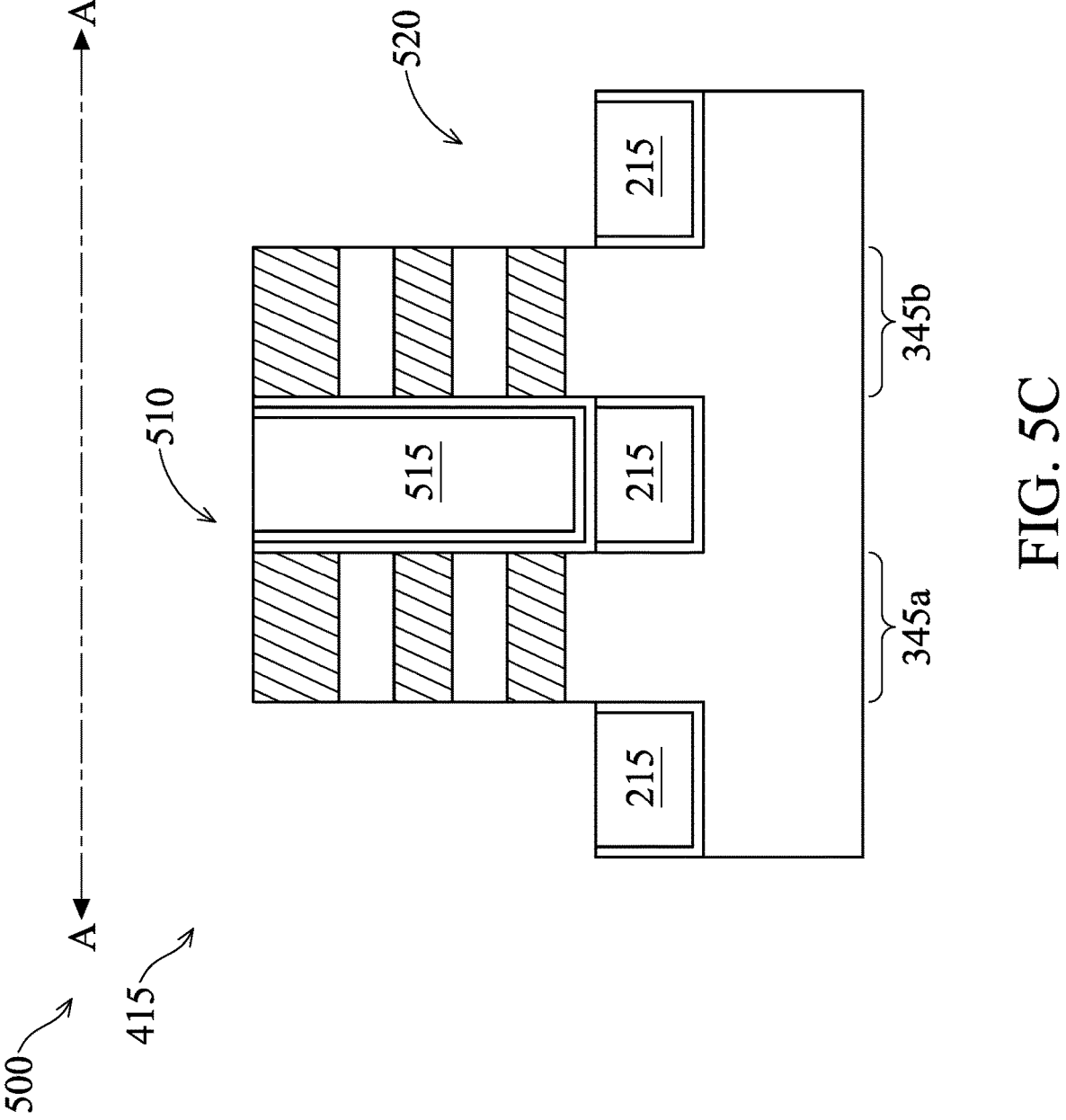

FIG. 5C illustrates a cross-sectional view of the region 415 along the line A-A. As shown in FIG. 5C, one or more of the semiconductor processing tools 102-112, have performed a combination of operations to remove portions of the liner layer 510 and the isolation layer 515. For example, the combination of operations may include a masking operation performed by the deposition tool 102 (e.g., spin coating a photoresist material), the exposure tool 104, and the developer tool 106. The combination of operations may further include an etching operation performed by the etch tool 108 to remove unmasked portions of the liner layer 510 and the isolation layer 515. The removed portions of the liner layer 510 and the isolation layer 515 may generate one or more recesses 520 over one or more of the STI regions 215.

Figure 5D:
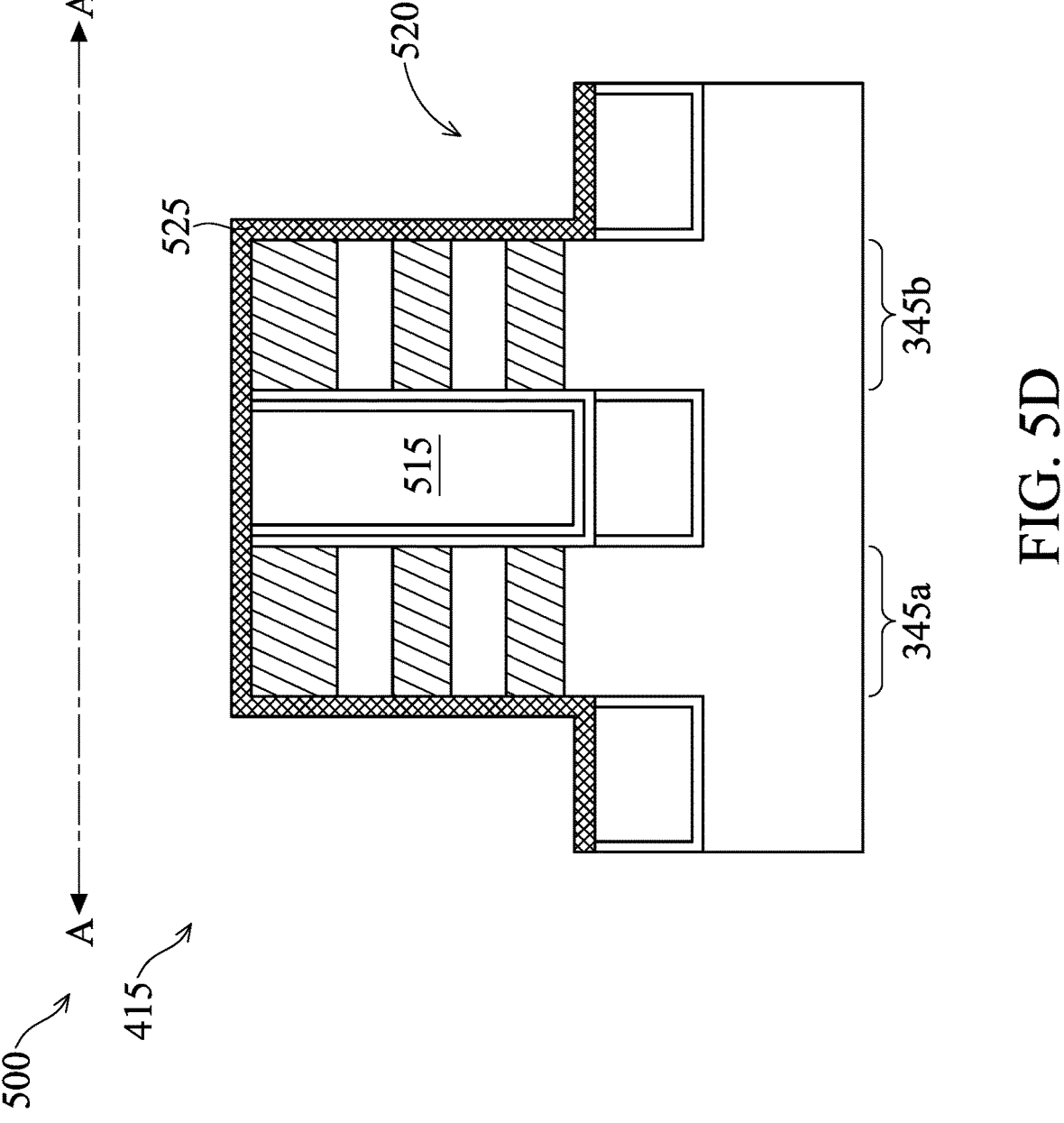

FIG. 5D illustrates a cross-sectional view of the region 415 along the line A-A. As shown in FIG. 5D, one or more of the semiconductor processing tools 102-112, such as the deposition tool 102, may have formed a cladding layer 525.

For example, the deposition tool 102 may have deposited a layer of a silicon germanium (SiGe) material, among other examples, using a CVD technique, a PVD technique, an ALD technique, and/or another deposition technique to form the cladding layer 525.

As shown, the cladding layer 525 is along a sidewall of the fin structure 345*a* (and/or along a sidewall of the fin structure 345*b*) adjacent to one of the recesses 520. The cladding layer 525 is not, however, along an opposite sidewall of the fin structure 345*a* (and/or along an opposite sidewall of the fin structure 345*b*) that is adjacent to the isolation layer 515.

Figure 5E:
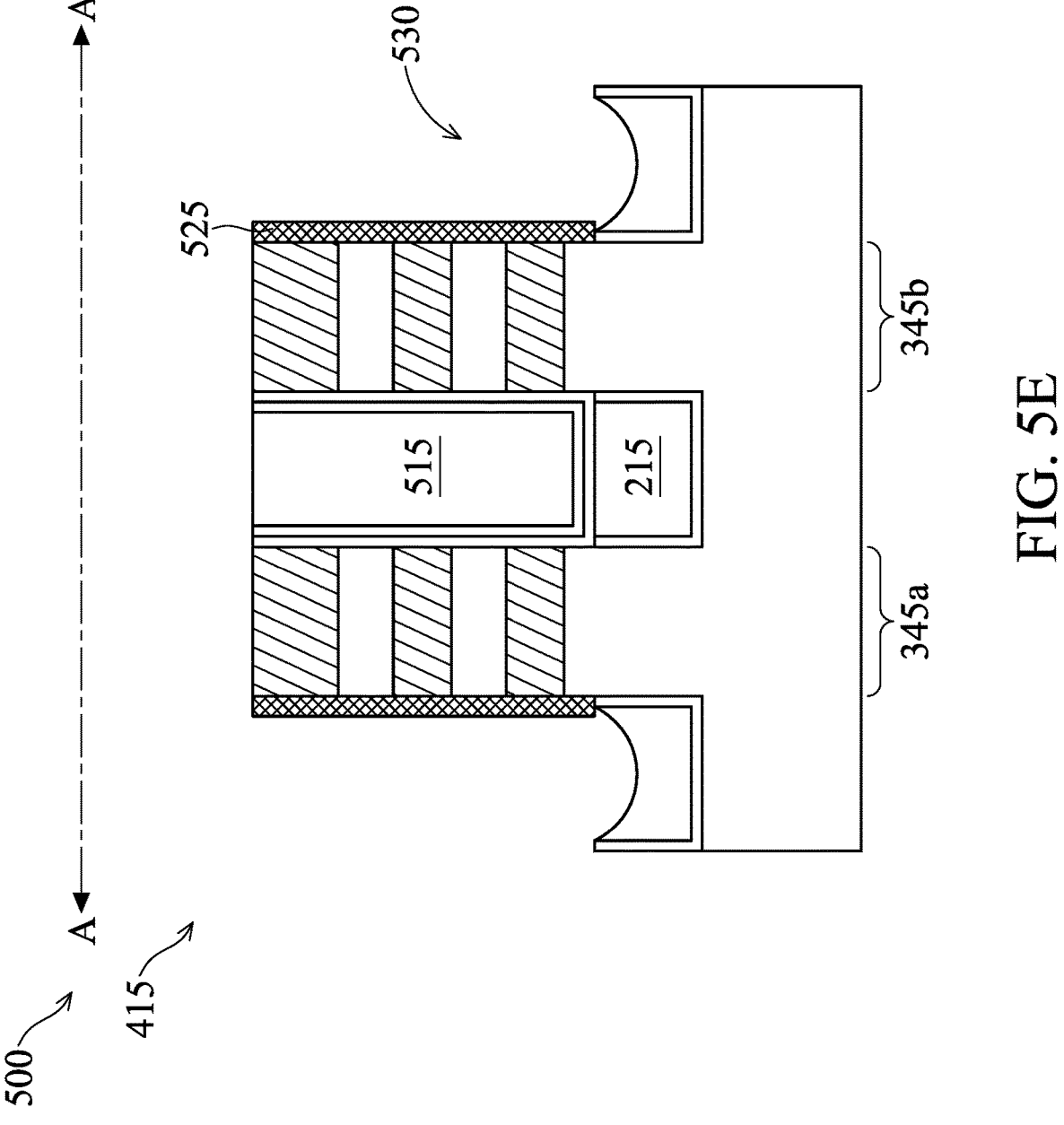

FIG. 5E illustrates a cross-sectional view of the region 415 along the line A-A. As shown in FIG. 5E, one or more of the semiconductor processing tools 102-112, such as the etch tool 108, may have removed portions of the of the cladding layer 525 and the STI regions 215 to form recesses 530. For example, the etch tool 108 may have performed an etching operation (e.g., an etch-back operation) using a plasma etch technique, a wet chemical etch technique, and/or another type of etch technique. The etching operation may form concave shaped surfaces into top portions of the STI regions 215.

As shown, the remaining portions of the cladding layer 525 are along sidewalls of the of the fin structures 345*a* and 345*b* adjacent to the recesses 530.

Figure 5F:
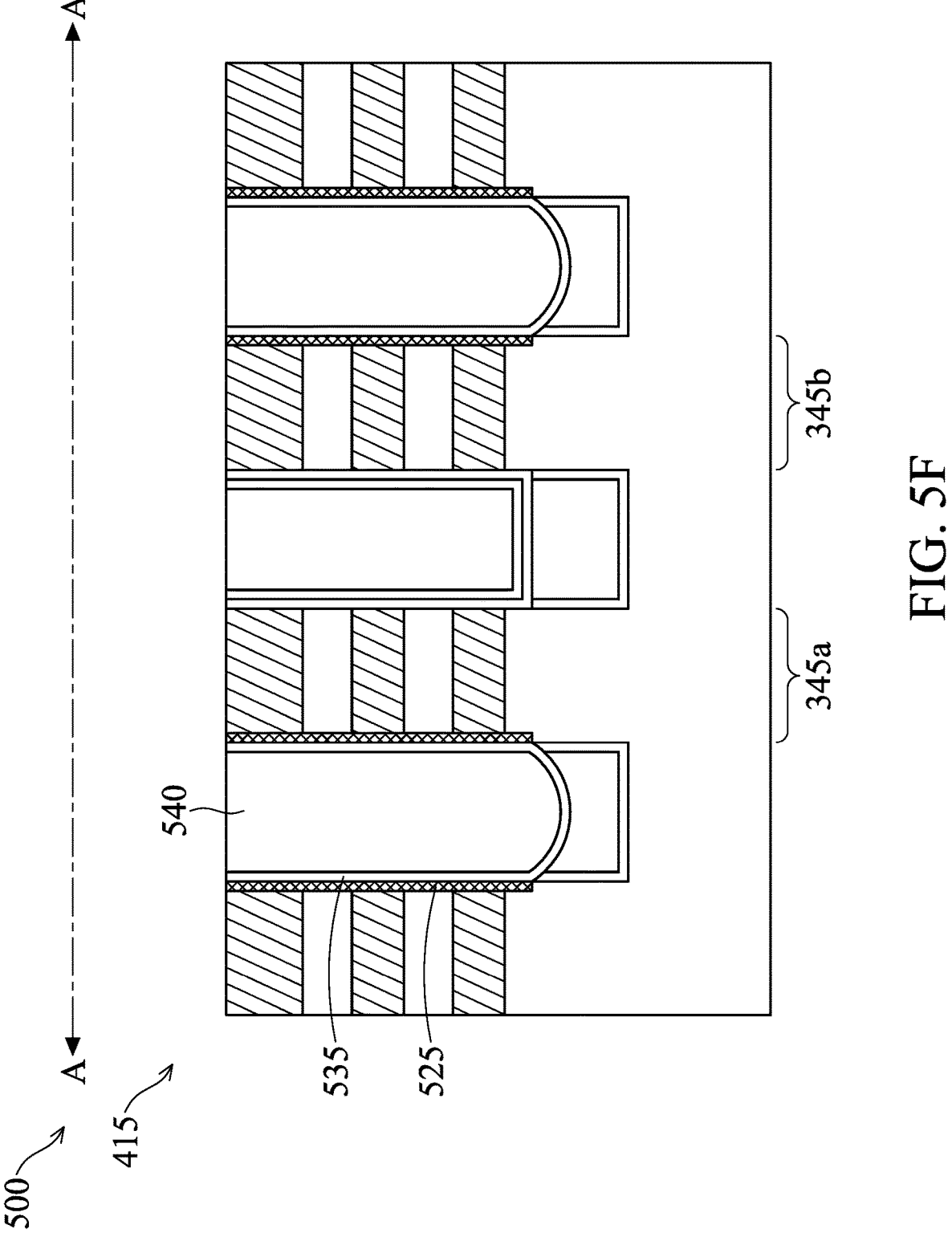

FIG. 5F illustrates a cross-sectional view of the region 415 along the line A-A. As shown in FIG. 5F, one or more of the semiconductor processing tools 102-112, such as the deposition tool 102, may have formed one or more layers of material (e.g., layers of a hybrid fin structure) in the recesses 530. For example, the deposition tool 102 may have deposited a liner layer 535 and an isolation layer 540. The liner layer 535 and the isolation layer 540 may include, for example, a silicon oxide ($SiO_x$) material, a silicon nitride ($Si_xN_y$) material, a silicon oxynitride (SiON) material, a silicon carbon nitride (SiCN) material, a fluoride-doped silicate glass (FSG) material, a low-k dielectric material, and/or another suitable insulating material. In some implementations, the liner layer 535 and the isolation layer 540 each include a different material. In some implementations, the liner layer 535 and the isolation layer 540 each include a same material. The deposition tool 102 may have deposited the liner layer 535 and the isolation layer 540 using a CVD technique, a PVD technique, an ALD technique, and/or another deposition technique.

Figure 5G:
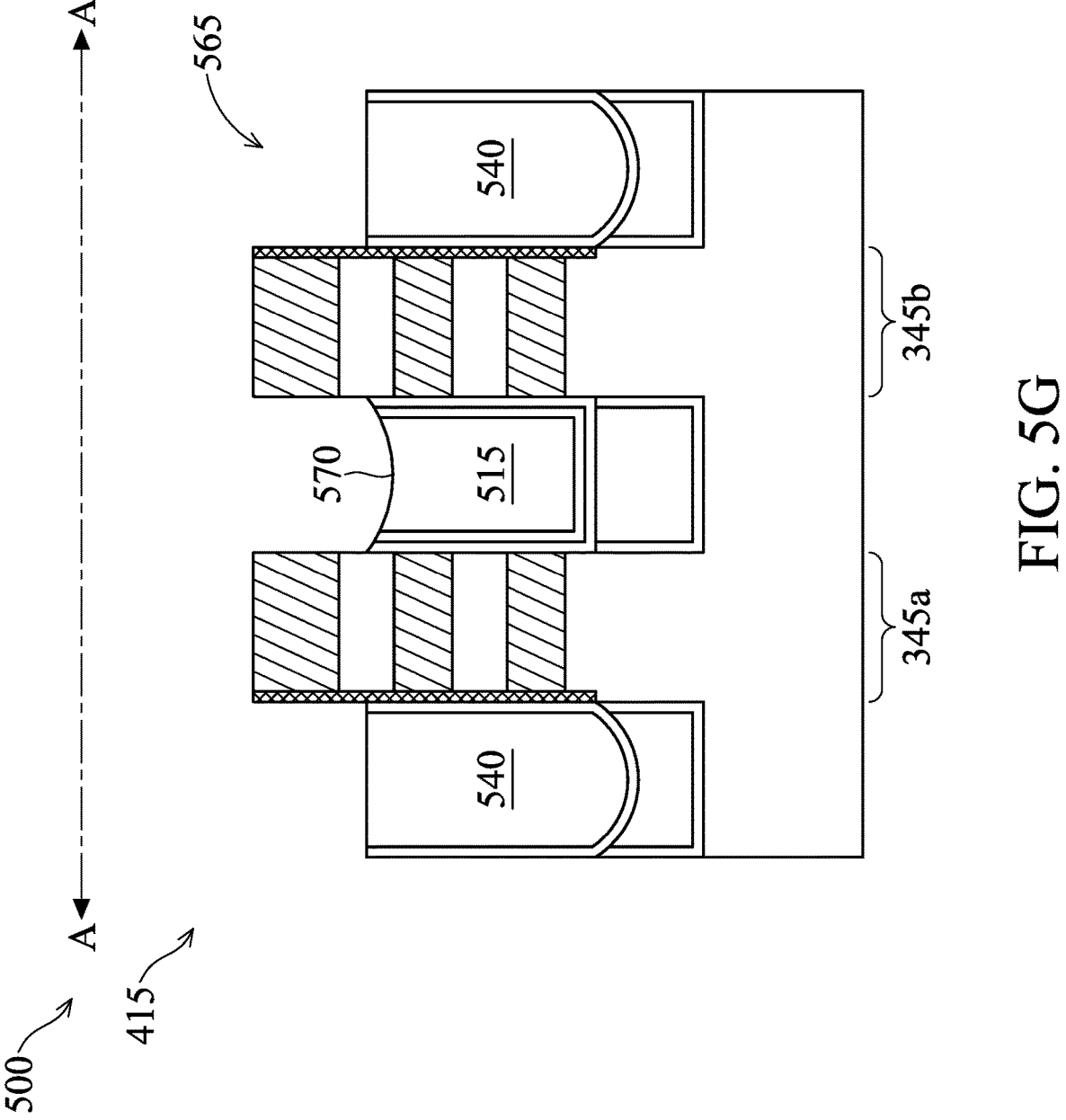

FIG. 5G illustrates a cross-sectional view of the region 415 along the line A-A. As shown in FIG. 5G, one or more of the semiconductor processing tools 102-112, such as the etch tool 108, may have removed portions of the liner layer 510, the isolation layer 515, the liner layer 535, and the isolation layer 540 to form one or more recesses 565 to receive deposits of a high-k dielectric material. For example, the etch tool 108 may have performed an etching operation using a plasma etch technique, a wet chemical etch technique, and/or another type of etch technique to form the recesses 565.

In a case where the isolation layer 515 includes a crystalline silicon-dioxide (c-$SiO_2$) material, an etch profile (e.g., etch rate) of the isolation layer 515 may be greater than that of the isolation layer 540. In such a case, the oxide-filled barrier structure 585 may include a taper shaped (or a concave shaped) surface 570 that extends into a top portion of the oxide-filled barrier structure 585, whereas the isolation layer 540 may include more of a planar surface.

Figure 5H:
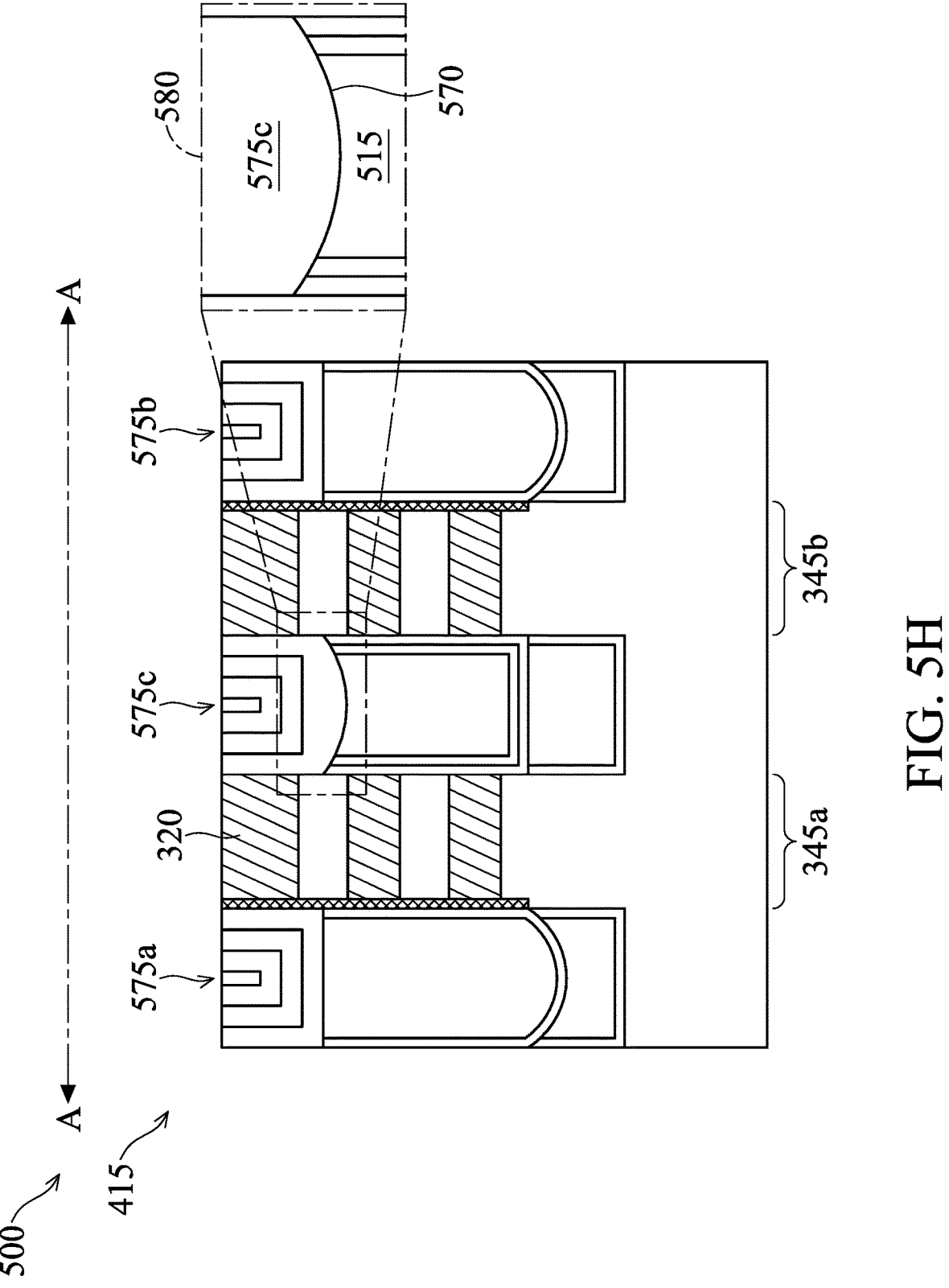

FIG. 5H illustrates a cross-sectional view of the region 415 along the line A-A. As shown in FIG. 5H, one or more of the semiconductor processing tools 102-112, such as the deposition tool 102 and the planarization tool 110, may have performed a series of operations to form high-k dielectric regions 575 (e.g., shown as high-k dielectric regions 575*a*-575*c*) in the recesses 565. One or more portions of the hard mask layer 320 are between the high-k dielectric regions 575.

For example, the deposition tool 102 may have deposited one or more layers of a high-k dielectric material in the recesses 565 (and over the fin structures 345*a* and 345*b*) using a CVD technique, a PVD technique, an ALD technique, and/or another deposition technique. The one or more layers of the high-k material in the high-k dielectric regions may include a hafnium oxide ($HfO_2$) material or a silicon nitride ($Si_xN_y$) material, among other examples.

After deposition of the one or more layers of the high-k material, the planarization tool 110 may have removed portions of the one or more layers of the high-k material from top regions of the recesses 565 and/or the fin structures 345*a* and 345*b* using a chemical mechanical planarization (CMP) process and/or another process that polishes or planarizes a layer or surface of deposited or plated material, among other examples.

As shown in FIG. 5H, the high-k dielectric region 575*c* (e.g., the high-k dielectric region over the isolation layer 515) includes an inverse taper shaped (e.g., or convex shaped) portion 580 that extends into the isolation layer 515. The inverse taper shaped portion 580 may extend to the taper shaped surface 570.

Figure 5I:
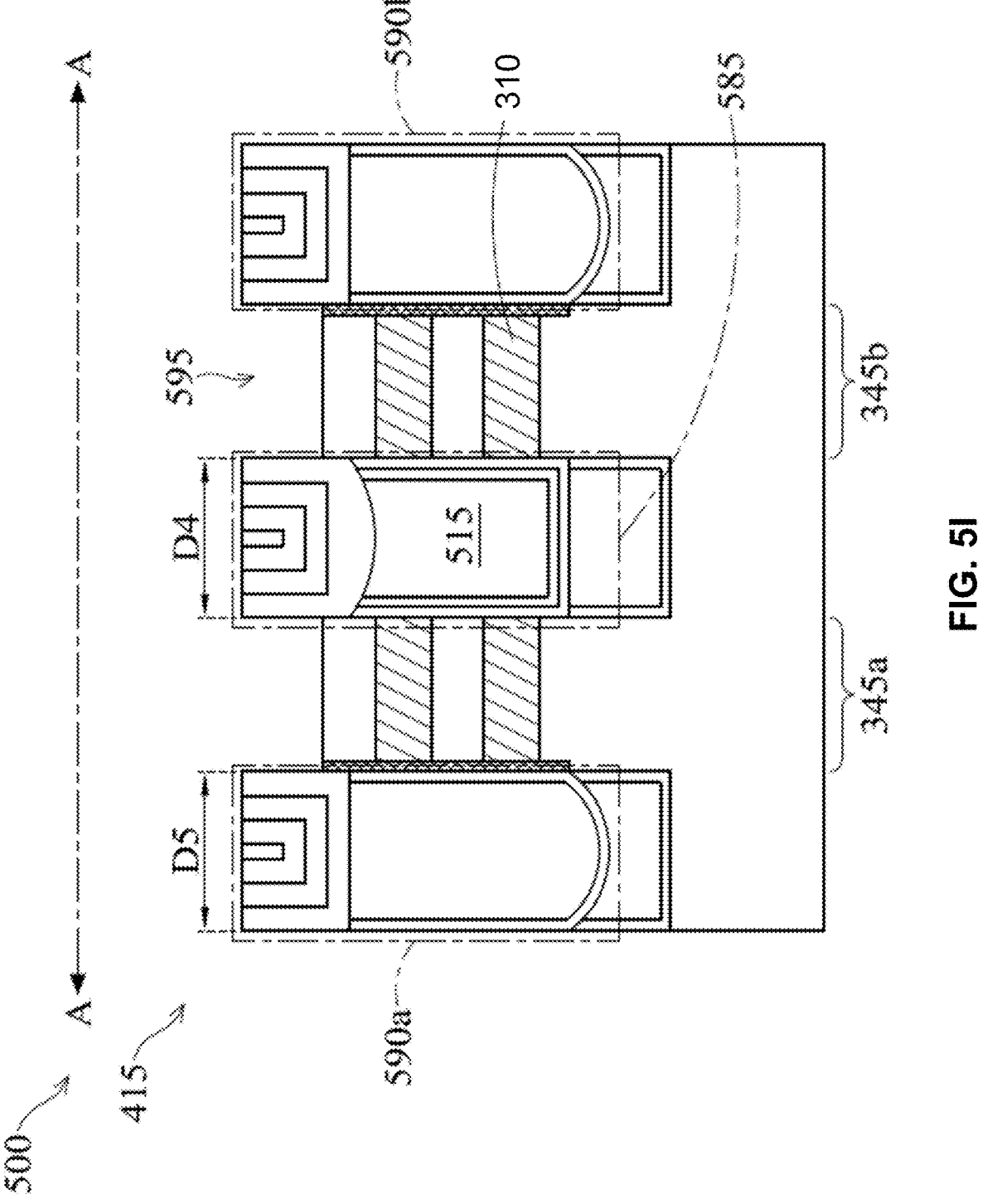

FIG. 5I illustrates a cross-sectional view of the region 415 along the line A-A. As shown in FIG. 5I, one or more of the semiconductor processing tools 102-112, such as the etch tool 108, may have removed the hard mask layer 320 as part of completing formation of an oxide-filled barrier structure 585 and hybrid fin structures 590*a* and 590*b*. For example, the etch tool 108 may have performed an etching operation using a plasma etch technique, a wet chemical etch technique, and/or another type of etch technique to remove the hard mask layer 320 and form recesses 595 between the oxide-filled barrier structure 585 and the hybrid fin structures 590*a* and 590*b*.

After formation, the oxide-filled barrier structure 585 may include a width D4. As an example, the width D4 may be included in a range of approximately 7 nanometers to approximately 20 nanometers. If the width D4 is less than approximately 7 nanometers, the isolation layer 515 may include voids or defects from the deposition process as described in connection with FIG. 5B. If the width D4 is greater than approximately 20 nanometers, a width of nanostructure layers (e.g., the second layers 315) may be less than what is needed to achieve a desired performance of the semiconductor device 202 (e.g., a desired performance of the nanostructure channels 220) including the oxide-filled barrier structure 585. However, other values and ranges for the width D4 are within the scope of the present disclosure.

Additionally, or alternatively, one or more of the hybrid fin structures 590*a* and 590*b* include a width D5. As an example, the width D5 may be included in a range of approximately nanometers to approximately 30 nanometers. However, other values and ranges for the width D5 are within the scope of the present disclosure.

In contrast to using a hybrid fin structure between the fin structures 345*a* and 345*b*, a use of the oxide-filled barrier 585 between the fin structures 345*a* and 345*b* may broaden design considerations for the semiconductor device 200. For example, and in comparison to a use of a hybrid fin structure between the fin structures 345*a* and 345*b*, the use of the oxide-filled barrier structure 585 may decrease a distance between the fin structures 345a and 345b. Additionally, or alternatively, a use of the oxide-filled barrier 585 may allow selecting different types of work-function metals to form a gate structure within the fin structures 345a and 345b (e.g., a PMOS fin structures and an NMOS fin structure, respectively). Additionally, or alternatively, a use of the oxide-filled barrier 585 may decrease a miller capacitance of a GAA transistor including the oxide-filled barrier 585 between the fin structures 345a and 345b relative to a GAA transistor including a hybrid fin structure between the fin structures 345a and 345b. Additionally or alternatively, and as described in connection with FIGS. 8A and 8B, a use of the oxide-filled barrier 585 may allow for a combining of the fin structures 345a and 345b. Combining of the fin structures 345a and 345b may be beneficial to integrated circuitry such as a complementary metal oxide semiconductor (CMOS) inverter or a six transistor (6T) static random access memory (SRAM) device including combined CMOS inverters.

The number and arrangement of structures, layers, and materials as shown in FIGS. 5A-5I are provided as one or more examples. In practice, there may be additional layers, different materials, differently arranged layers, additional structures, different structures, or different dimensions than those shown in FIGS. 5A-5I.

Figure 6:
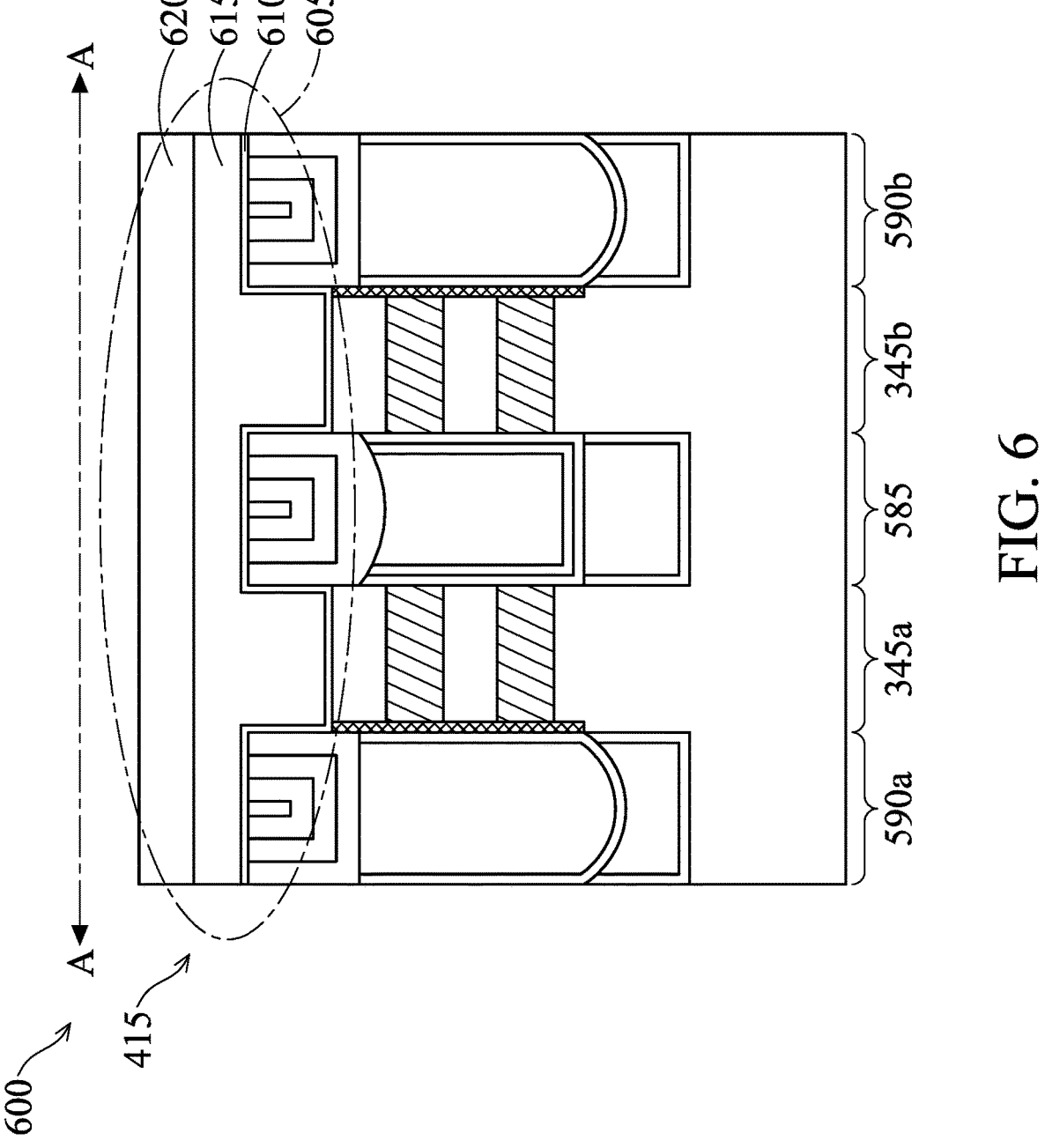
FIG. 6 is a diagram of an example dummy gate structure formation process described herein.

FIG. 6 is a diagram of an example dummy (e.g., temporary) gate structure formation process described herein. The semiconductor device 200 may include one or more additional devices, structures, and/or layers not shown in FIG. 6. In some implementations, the operations described in connection with the example implementation 600 are performed after the processes described in connection with FIGS. 3A-5I.

FIG. 6 illustrates a cross-sectional view of the region 415 along the line A-A. As shown in FIG. 6, one or more of the semiconductor processing tools 102-112, such as the deposition tool 102, may form one or more layers of a dummy gate structure 605 over the fin structures 345a and 345b, over the hybrid fin structures 590a and 590b, and over the oxide-filled barrier structure 585.

For example, and as part of forming the dummy gate structure 605, the deposition tool 102 may deposit a gate dielectric layer 610 using a CVD technique, a PVD technique, an ALD technique, and/or another deposition technique. The gate dielectric layer 610 may include a silicon oxide ($SiO_2$) material, a silicon nitride ($Si_3N_4$) material, a high-k dielectric material, and/or another suitable material, among other examples. In some implementations, the gate dielectric layer 610 is omitted from the dummy gate structure formation process and is instead formed in a replacement gate process.

Additionally, or alternatively, the deposition tool 102 may deposit a gate electrode layer 615 over the gate dielectric layer 610 using a CVD technique, a PVD technique, an ALD technique, and/or another deposition technique. The gate electrode layer 615 may include a polycrystalline silicon (polysilicon or PO) material or another suitable material, among other examples.

Additionally, or alternatively, the deposition tool 102 may deposit a hard mask layer 620 over the gate electrode layer 615 using a CVD technique, a PVD technique, an ALD technique, and/or another deposition technique. The hard mask layer 620 may include a silicon oxide ($SiO_2$) material or a silicon nitride ($Si_3N_4$) material, among other examples.

The dummy gate structure 605 is a temporary structure to be replaced by a replacement gate structure or a replacement gate stack (e.g., the gate structure 240) at a subsequent processing stage for the semiconductor device 200. The dummy gate structure 605 may also define source/drain (S/D) regions of the fin structures 345a and 345b, such as the regions of the fin structures 345a and 345b adjacent to and on opposing sides of channel regions of the semiconductor device 200.

As indicated above, FIG. 6 is provided as an example. Other examples may differ from what is described with regard to FIG. 6.

FIGS. 7A-7D are diagrams of an example implementation 700 of a replacement gate process described herein. In some implementations, the replacement gate process is performed after combinations of operations performed by the semiconductor processing tools 102-112 to form the source/drain regions 225 of the semiconductor device 200 and remove one or more portions of the dummy gate structure 605.

Figure 7A:
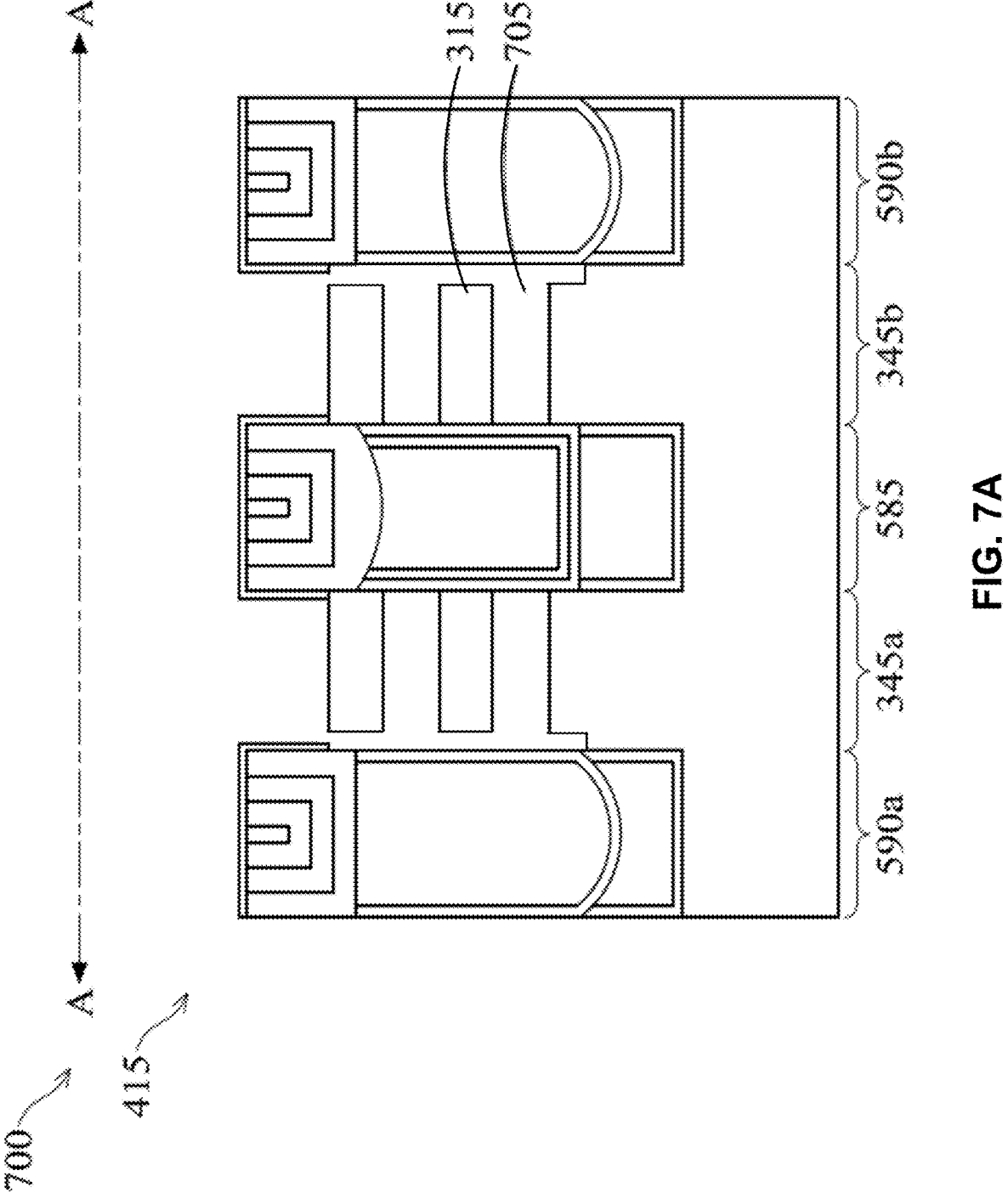
FIGS. 7A-7D are diagrams of an example implementation of a replacement gate process described herein.

FIG. 7A illustrates a cross-sectional view of the region 415 along the line A-A. As shown in FIG. 7A, one or more of the semiconductor processing tools 102-112, such as the etch tool 108, may have removed one or more portions of the cladding layer 525 and the first layers 310. For example, the etch tool 108 may have performed an etching operation (e.g., a selective etch operation) using a plasma etch technique, a wet chemical etch technique, and/or another type of etch technique, to remove the one or more portions of the cladding layer 525 and the first layers 310. After removal of the one or more portions of the cladding layer 525 and the first layers 310, one or more cavities 705 (e.g., spaces or gaps) remain between the second layers 315.

Figure 7B:
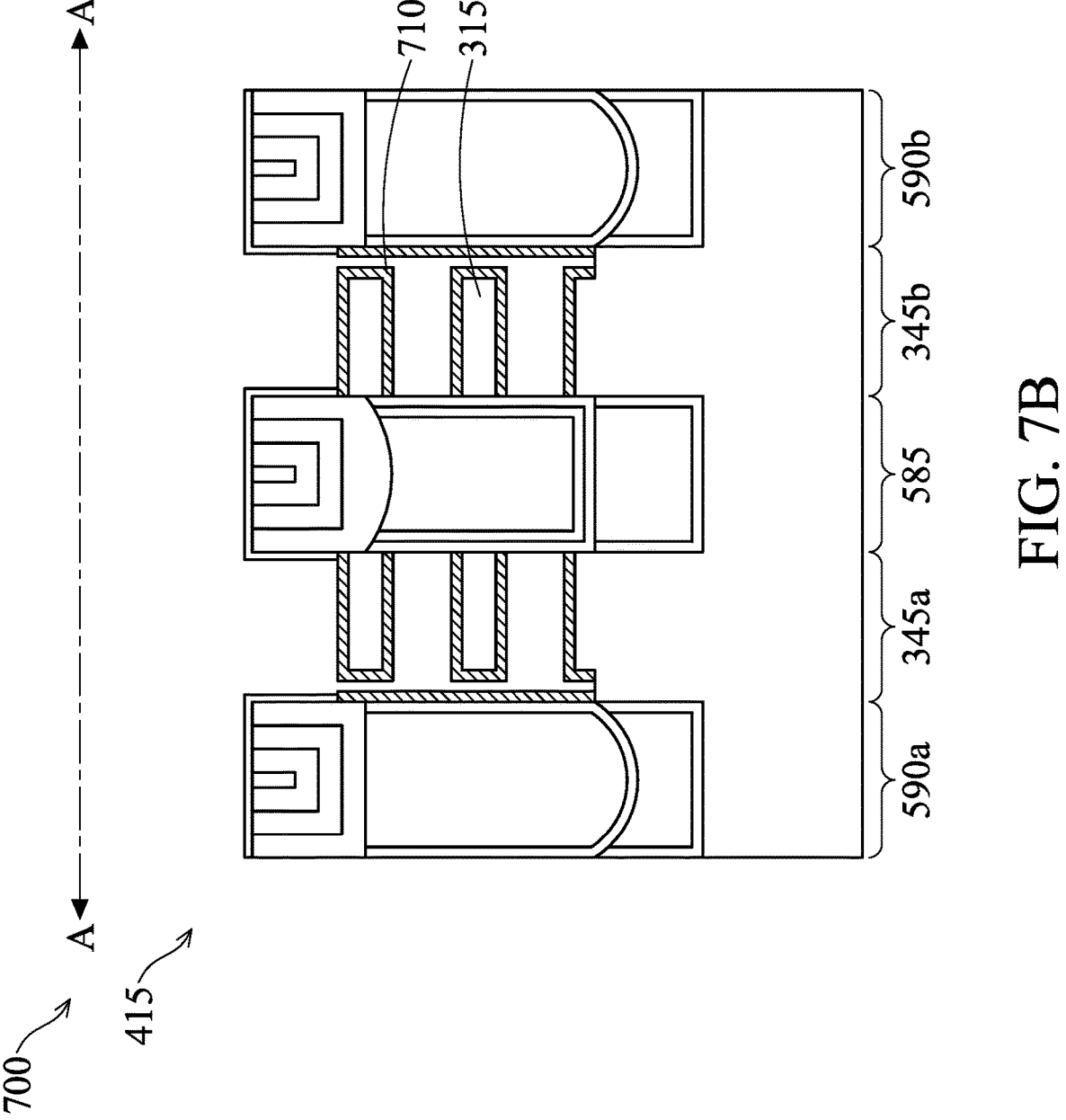

FIG. 7B illustrates a cross-sectional view of the region 415 along the line A-A. As shown in FIG. 7B, one or more of the semiconductor processing tools 102-112, such as the deposition tool 102, may have formed a high-k dielectric liner 710 around the second layers 315 (e.g., the second layers 315 are being transformed to nanostructure channels of a nanostructure transistor) using a CVD technique, a PVD technique, an ALD technique, and/or another deposition technique. The high-k dielectric liner 710 may include a hafnium oxide ($HfO_2$) material or a silicon nitride ($Si_xN_y$) material, among other examples.

Figure 7C:
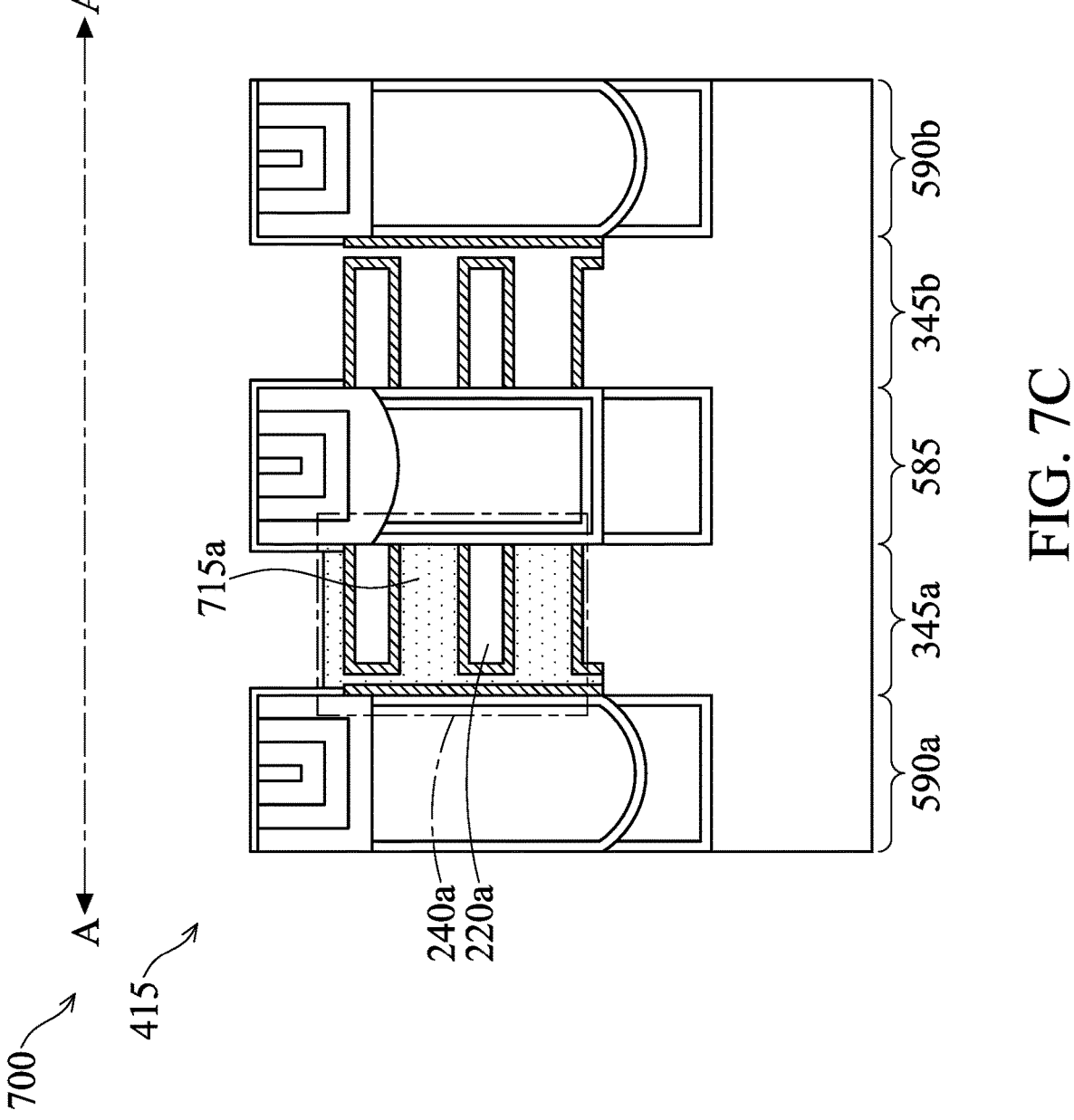

FIG. 7C illustrates a cross-sectional view of the region 415 along the line A-A. As shown in FIG. 7C, one or more of the semiconductor processing tools 102-112 may perform a series of operations to form a portion of a gate structure 240a including a work-function metal layer 715a that wraps around the nanostructure channels 220a in the fin structure 345a (e.g., a PMOS fin structure). For example, the deposition tool 102, the exposure tool 104, and the developer tool 106 may, using photolithography techniques, may mask the fin structure 345b. After the masking of the fin structure 345b, the deposition tool 102 may form, in the cavities 705 of the fin structure 345a, the work-function metal layer 715a using a CVD technique, a PVD technique, an ALD technique, and/or another deposition technique. The work-function metal layer 715a may include a $p^+$ work-function metal material (e.g., a work-function metal material heavily doped with electron holes and having a bandgap included in a range of approximately 5 electron volts to approximately 5.2 electron volts, among other examples). Examples of the $p^+$ work-function metal material include a molybdenum (Mo) material, a ruthenium (Ru) material, an iridium (Ir) material, a platinum (Pt) material, a platinum silicide (PtSi) material, or a molybdenum nitride (MoN) material, among other examples.

Figure 7D:
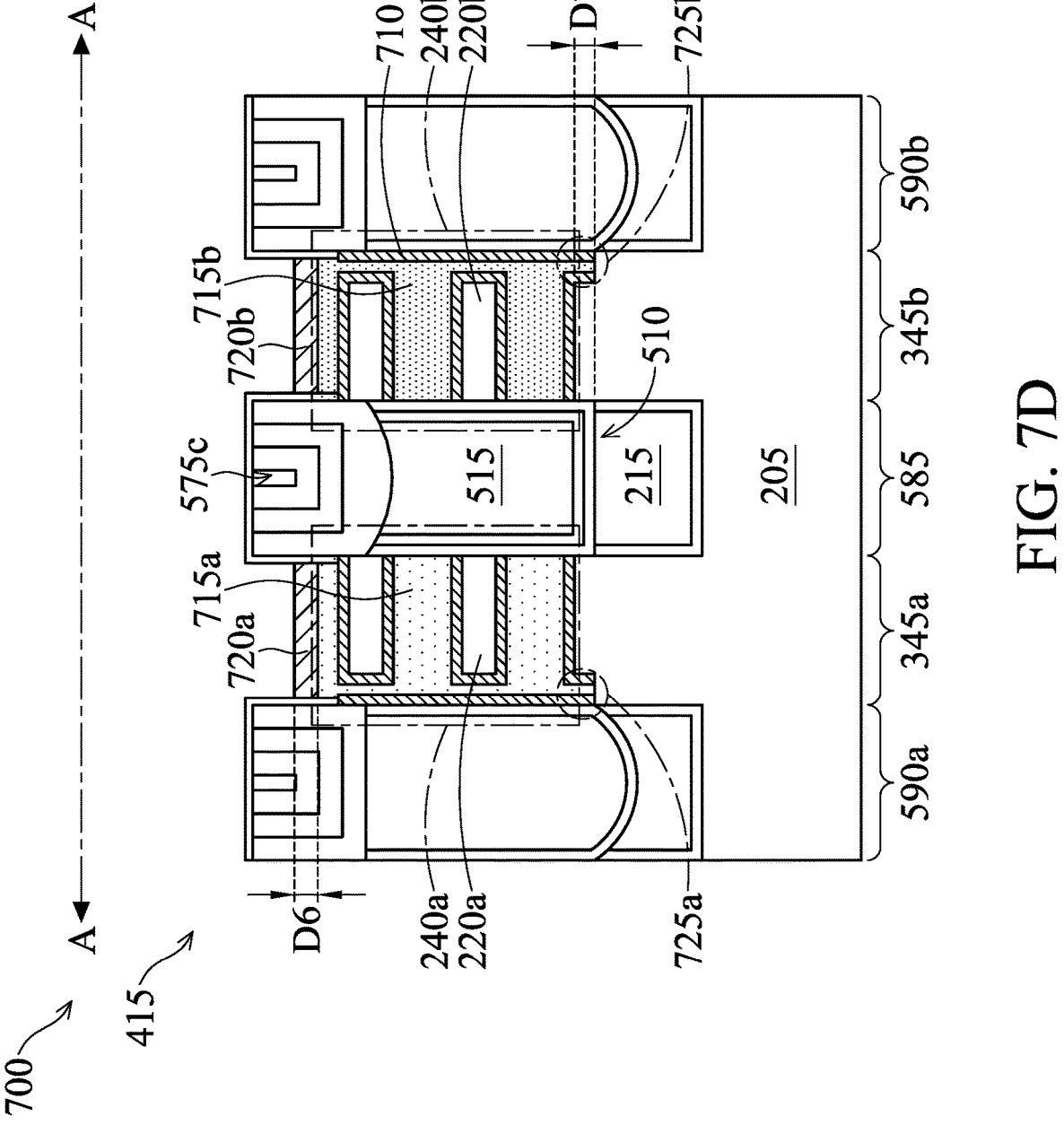

FIG. 7D illustrates a cross-sectional view of the region 415 along the line A-A. As shown in FIG. 7D, one or more of the semiconductor processing tools 102-112 may perform a series of operations to form a portion of a gate structure 240b including a work-function metal layer 715b that wraps around the nanostructure channels 220b in the fin structure 345b (e.g., an NMOS fin structure). For example, the deposition tool 102, the exposure tool 104, and the developer tool 106 may, using photolithography techniques, mask the fin structure 345a. After the masking of the fin structure 345a, the deposition tool 102 may form, in the cavities 705 of the fin structure 345a, the work-function metal layer 715b using a CVD technique, a PVD technique, an ALD technique, and/or another deposition technique. The work-function metal layer 715b may include an $n^+$ work-function metal material (e.g., a work-function metal material heavily doped with electrons and having a bandgap included a range of approximately 4.1 electron volts to approximately 4.3 electron volts, among other examples). Examples of the $n^+$ work-function metal material include a titanium (Ti) material, an aluminum (Al) material, a tantalum (Ta) material, a zirconium silicate ($ZrSi_2$) material, or a tantalum nitride (TaN) material, among other examples.

FIG. 7D further illustrates portions 720a and 720b of a conductive layer 720 (e.g., a metal gate layer). One or more of the semiconductor processing tools 102-112 may perform a series of operations to form the portions 720a and 720b. For example, the deposition tool 102 may deposit the conductive layer 720 over the fin structures 345a and 345b (including the gate structures 240a and 240b), over the oxide-filled barrier structure 585, and over the hybrid fin structures 590a and 590b using a CVD technique, a PVD technique, an ALD technique, and/or another deposition technique. The conductive layer 720 may include a tungsten (W) material or another suitable conductive material, among other examples. The deposition tool 102, the exposure tool 104, and the developer tool 106 may then, using photolithography techniques, mask the fin structure 345a and 345b. After the masking of the fin structure 345a and 345b, the etch tool 108 may, using a plasma etch technique, a wet chemical etch technique, and/or another type of etch technique, remove portions of the conductive layer 720 to form the portions 720a and 720b.

In some implementations, the portions 720a and 720b include a thickness D6. For example, the thickness D6 may be included in a range of approximately 3 nanometers to approximately 20 nanometers. However, other values and ranges for the thickness D6 are within the scope of the present disclosure.

In some implementations, and as shown in FIG. 7D, the gate structures 240a and 240b include tail structures (e.g., a tail structure 725a and a tail structure 725b). In such cases, the tail structures 725a and 725b may include portions of the work-function metal layers 715a and 715b. Additionally, or alternatively, the tail structures 725a and 725b may include portions of the high-k dielectric liner 710. In some implementations, the tail structures 725a and 725b extend towards the STI regions 215.

As shown in FIG. 7D, the oxide-filled barrier structure 585 may include a depth D7 that extends below a bottom surface of the gate structure 240b (and/or the gate structure 240a). The depth D7 may be included in a range of approximately 3 nanometers to approximately 20 nanometers. If the depth D7 is less than approximately 3 nanometers, excessive etching/removal of the first layers 310 and/or an under-etching of a cavity for the STI regions 215 may have occurred. If the depth D7 is greater than approximately 20 nanometers, removal of the first layers 310 may have failed and/or an over-etching of the cavity for the STI regions may have occurred. However, other values and ranges for the depth D7 are within the scope of the present disclosure.

As shown in FIG. 7D, the region 415 (e.g., of the semiconductor device 200) may include a p-type metal-oxide semiconductor (PMOS) nanostructure transistor including the first plurality of the nanostructure channels 220a over the semiconductor substrate 205. In some implementations, the first plurality of the nanostructure channels 220a are arranged in a direction that is perpendicular to the semiconductor substrate 205. The PMOS nanostructure transistor includes the first gate structure 240a wrapping around each of the first plurality of nanostructure channels 220a. The region 415 also includes an n-type metal-oxide semiconductor (NMOS) nanostructure transistor including the second plurality of nanostructure channels 220b over the semiconductor substrate 205. In some implementations, the second plurality of nanostructure channels 220b are arranged in a direction that is perpendicular to the semiconductor substrate 205. The NMOS nanostructure transistor includes the second gate structure 240b wrapping around each of the second plurality of nanostructure channels 220. The region 415 (e.g., of the semiconductor device 200) further includes the oxide-filled barrier structure 585 between the first plurality of nanostructure channels 220a and the second plurality of nanostructure channels 220b. In some implementations, the oxide-filled barrier structure 585 includes a crystalline silicon-dioxide material (e.g., the isolation layer 515) lined with a dielectric material (e.g., the liner layer 510).

The number and arrangement of structures, layers, materials, and dimensions as shown in FIGS. 7A-7D are provided as one or more examples. In practice, there may be additional layers, different materials, differently arranged layers, additional structures, different structures, or different dimensions than those shown in FIGS. 7A-7D.

Figure 8A:
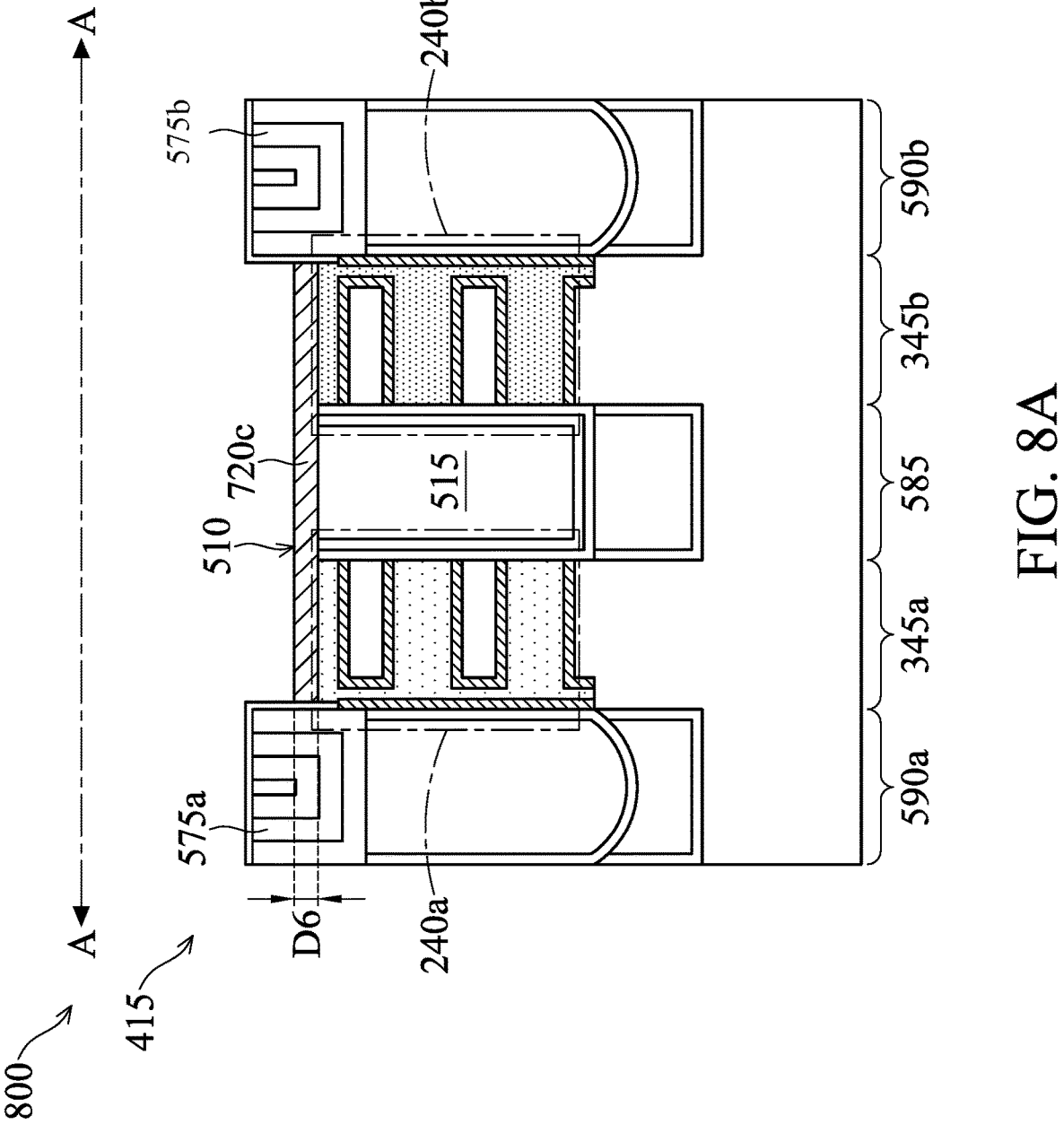
FIGS. 8A and 8B are diagrams of an example implementation described herein.
Figure 8B:
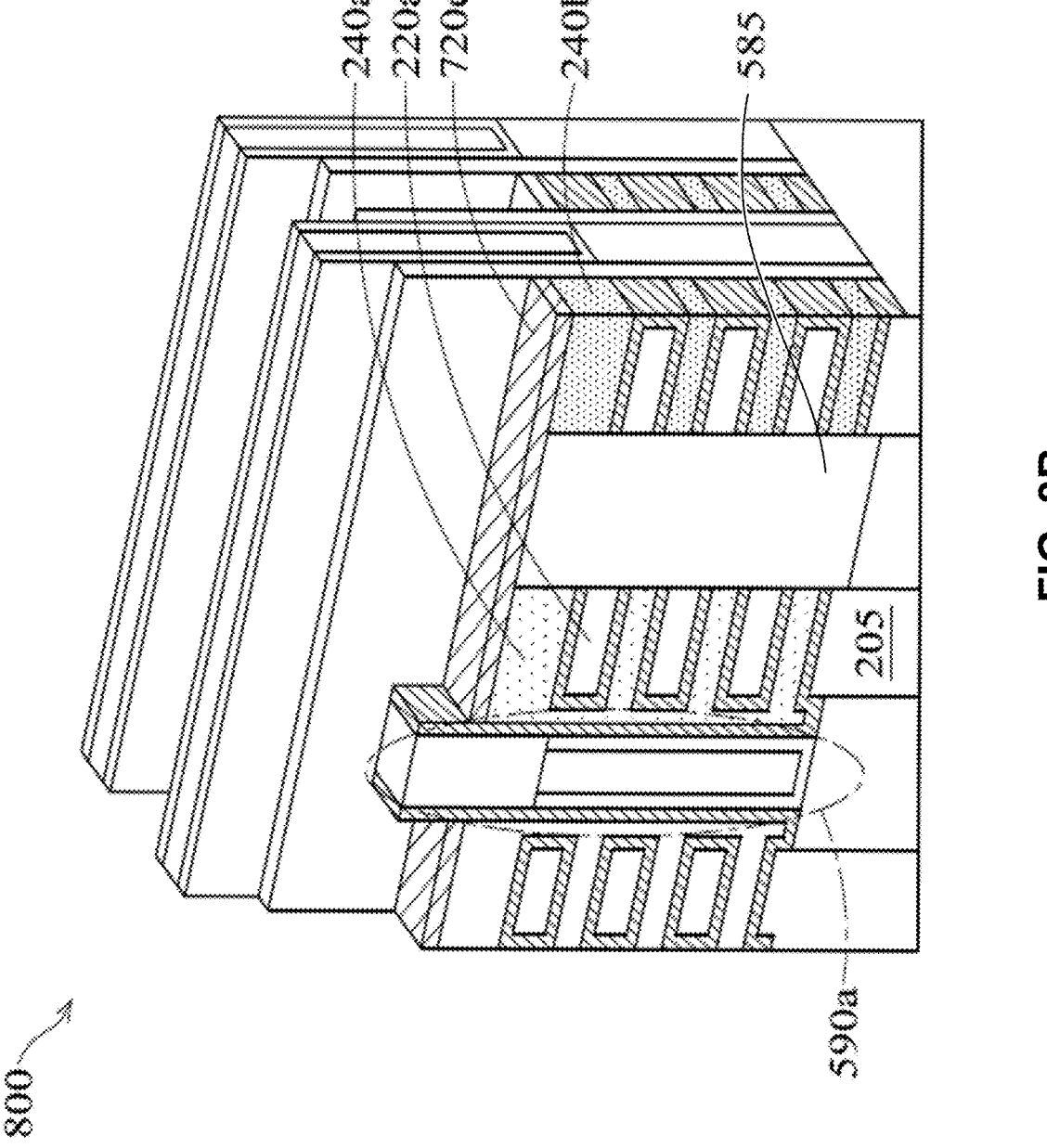

FIGS. 8A and 8B are diagrams of an example implementation 800 described herein. In the implementation 800, a portion 720c of the conductive layer 720 may electrically connect the gate structure 240a and the gate structure 240b.

One or more of the semiconductor processing tools 102-112 may perform a series of operations to form the portion 720c. For example, the deposition tool 102, the exposure tool 104, and the developer tool 106 may, using photolithography techniques, mask the fin structure 345a, the fin structure 345b, the hybrid fin structure 590a, and the hybrid fin structure 590b. After the masking, the etch tool 108 may, using a plasma etch technique, a wet chemical etch technique, and/or another type of etch technique, remove the high-k dielectric region 575c. The deposition tool 102 may then deposit the conductive layer 720 over the fin structures 345a and 345b (including the gate structures 240a and 240b), over the oxide-filled barrier structure 585, and over the hybrid fin structures 590a and 590b using a CVD technique, a PVD technique, an ALD technique, and/or another deposition technique. The deposition tool 102, the exposure tool 104, and the developer tool 106 may perform another masking operation to mask the fin structures 345a and 345b and the oxide-filled barrier structure 585 (e.g., the isolation layer 515 and the liner layer 510). The etch tool 108 may then, using a plasma etch technique, a wet chemical etch technique, and/or another type of etch technique, remove portions of the conductive layer 720 over the hybrid fin structures 590a and 590b to form the portion 720c.

In some implementations, the portion 720c a thickness D6. For example, the thickness D6 may be included in a range of approximately 3 nanometers to approximately 20 nanometers. However, other values and ranges for the thickness D6 are within the scope of the present disclosure.

FIG. 8B shows an isometric view of the region 415. As shown in FIG. 8B, the region 415 (e.g., of the semiconductor device 200) includes the plurality of channel layers (e.g., the nanostructure channels 220a) over the semiconductor substrate 205. In some implementations, the plurality of channel layers are arranged in a direction that is perpendicular to the semiconductor substrate 205. The region 415 includes the gate structure wrapping 240a around each of the plurality of channel layers. The region 415 includes the hybrid fin structure 590a adjacent to a first side of the plurality of channel layers and the oxide-filled barrier structure 585 adjacent to a second side of the plurality of channel layers that is opposite the first side. Also, as shown in FIG. 8B, the portion 720c of the conductive layer 720 electrically connects the gate structure 240a and the gate structure 240b.

The number and arrangement of structures, layers, and materials as shown in FIGS. 8A and 8B are provided as one or more examples. In practice, there may be additional layers, different materials, differently arranged layers, additional structures, or different structures than those shown in FIGS. 8A and 8B.

Figure 9:
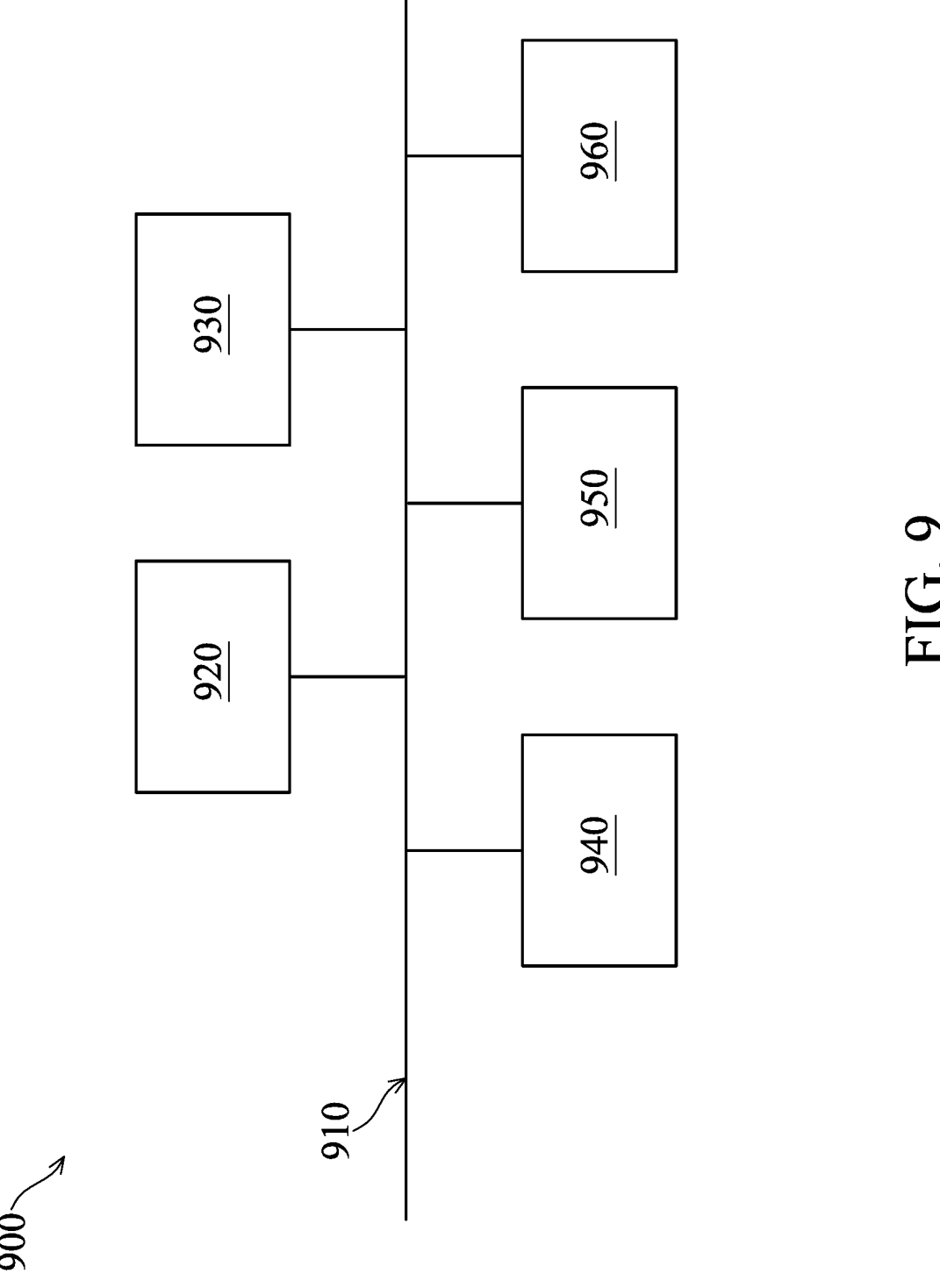
FIG. 9 is a diagram of example components of one or more devices described herein.

FIG. 9 is a diagram of example components of one or more devices 900 described herein. In some implementations, one or more of the semiconductor processing tools 102-112 and/or the wafer/die transport tool 114 may include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

FIG. 10 is a flowchart of an example process 1000 associated with forming the semiconductor device described 200 herein. In some implementations, one or more process blocks of FIG. 10 are performed by one or more semiconductor processing tools (e.g., one or more of the semiconductor processing tools 102-112). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming a plurality of nanostructure layers (block 1010). For example, one or more of the semiconductor processing tools 102-112, such as the deposition tool 102, may form a plurality of nanostructure layers (e.g., the second layers 315), as described above. In some implementations, the plurality of nanostructure layers are formed over a semiconductor substrate 205 and are arranged along a direction that is perpendicular to the semiconductor substrate 205.

As further shown in FIG. 10, process 1000 may include forming layers of an oxide-filled barrier structure adjacent to a first side of the plurality of nanostructure layers (block 1020). For example, one or more of the semiconductor processing tools 102-112, such the deposition tool 102, may form the layers of the oxide-filled barrier structure 585 (e.g., the liner layer 510 and the isolation layer 515) adjacent to a first side of the plurality of nanostructure layers, as described above.

As further shown in FIG. 10, process 1000 may include forming a cladding layer on a second side of the plurality of nanostructure layers that is opposite the first side (block 1030). For example, one or more of the semiconductor processing tools 102-112, such as the deposition tool 102, may form a cladding layer 525 on a second side of the plurality of nanostructure layers that is opposite the first side, as described above.

As further shown in FIG. 10, process 1000 may include forming layers of a hybrid fin structure adjacent to the cladding layer (block 1040). For example, one or more of the semiconductor processing tools 102-112, such as the deposition tool 102, may form layers of a hybrid fin structure 590 (e.g., the liner layer 535 and the isolation layer 540) adjacent to the cladding layer 525, as described above.

As further shown in FIG. 10, process 1000 may include removing the cladding layer (block 1050). For example, one or more of the semiconductor processing tools 102-112, such as the etch tool 108, may remove the cladding layer 525, as described above. In some implementations, removing the cladding layer 525 includes removing a plurality of sacrificial layers (e.g., the first layers 310) between the plurality of nanostructure layers.

As further shown in FIG. 10, process 1000 may include forming a gate structure that wraps around the plurality of nanostructure layers (block 1060). For example, one or more of the semiconductor processing tools 102-112, such as the deposition tool 102, may form the gate structure 240 that wraps around the plurality of nanostructure layers, as described above.

Process 1000 may include additional implementations, such as any single implementation or any combination of implementations described below and/or in connection with one or more other processes described elsewhere herein.

In a first implementation, forming the layers 510, 515 of the oxide-filled barrier structure 585 includes forming a liner layer 510 along a sidewall of the first plurality of nanostructure layers, and forming an isolation layer 515 over the liner layer 510.

In a second implementation, alone or in combination with the first implementation, forming the liner layer 510 includes forming the liner layer 510 by depositing one or more layers of a silicon dioxide material or a silicon carbon oxy nitride material.

In a third implementation, alone or in combination with one or more of the first and second implementations, forming the isolation layer 515 includes forming the isolation layer 515 by depositing a crystalline silicon-dioxide material.

In a fourth implementation, alone or in combination with one or more of the first through third implementations, forming the layer 715a of the gate structure 240a includes forming the layer 715a of the gate structure 240a by depositing a p$^+$ work-function metal in cavities 705 formed by the removing of the plurality of sacrificial layers.

In a fifth implementation, alone or in combination with one or more of the first through fourth implementations, forming the layer 715b of the gate structure 240b includes forming the layer 715b of the gate structure 240b by depositing an n$^+$ work-function metal in cavities 705 formed by the removing of the plurality of sacrificial layers.

In a sixth implementation, alone or in combination with one or more of the first through fifth implementations, process 1000 includes removing portions of the layers 510, 515 of the oxide-filled barrier structure 585 prior to removing the cladding layer 525, where removing the portions of the layers 510, 515 of the oxide-filled barrier structure 585 form a recessed surface 555 at a top of the oxide-filled barrier structure 585, and forming a high-k dielectric region 575c over the recessed surface 555 prior to removing the cladding layer 525.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Some implementations described herein provide a semiconductor device having an oxide-filled barrier structure between structures of GAA transistors included in the semiconductor device. The use of the oxide-filled barrier structure may reduce a distance separating nanosheet structures of a PMOS fin structure and an NMOS fin structure, broaden an availability of work-function metals for gate structures formed around nanochannels of the PMOS fin structure and NMOS structure, and improve a performance of the GAA transistors by reducing miller capacitances of the GAA transistors. Furthermore, the oxide-filled barrier structure may enable the combining of the PMOS fin structure and the NMOS fin structure to form a type of integrated circuitry, such as an inverter.

In this way, design considerations for the semiconductor device including the oxide-filled barrier structure between nanostructures of the PMOS fin structure and the NMOS fin structure may be broadened. Furthermore, a cost of the semiconductor device may be reduced, a performance of the semiconductor device may be increased, and/or integrated circuitry including a combination of the PMOS fin structure and the NMOS fin structure may be formed.

As described in greater detail above, some implementations described herein provide a semiconductor device. The semiconductor device includes a p-type metal-oxide semiconductor nanostructure transistor including a first plurality of nanostructure channels over a semiconductor substrate, where the first plurality of nanostructure channels are arranged in a direction that is perpendicular to the semiconductor substrate, and a first gate structure wrapping around each of the first plurality of nanostructure channels. The semiconductor device includes an n-type metal-oxide semiconductor nanostructure transistor including a second plurality of nanostructure channels over the semiconductor substrate, where the second plurality of nanostructure channels are arranged in a direction that is perpendicular to the semiconductor substrate, and a second gate structure wrapping around each of the second plurality of nanostructure channels. The semiconductor device includes an oxide-filled barrier structure between the first plurality of nanostructure channels and the second plurality of nanostructure channels, where the oxide-filled barrier structure includes a crystalline silicon-dioxide material lined with a dielectric material.

As described in greater detail above, some implementations described herein provide a method. The method includes forming a plurality of nanostructure layers, where the plurality of nanostructure layers are formed over a semiconductor substrate and are arranged along a direction that is perpendicular to the semiconductor substrate. The method includes forming layers of an oxide-filled barrier structure adjacent to a first side of the plurality of nanostructure layers. The method includes forming a cladding layer on a second side of the plurality of nanostructure layers that is opposite the first side. The method includes forming layers of a hybrid fin structure adjacent to the cladding layer. The method includes removing the cladding layer, where removing the cladding layer includes removing a plurality of sacrificial layers between the plurality of nanostructure layers. The method includes forming a layer of a gate structure that wraps around the plurality of nanostructure layers.

As described in greater detail above, some implementations described herein provide a semiconductor device. The semiconductor device includes a plurality of channel layers over a semiconductor substrate, where the plurality of channel layers are arranged in a direction that is perpendicular to the semiconductor substrate. The semiconductor device includes a gate structure wrapping around each of the plurality of channel layers. The semiconductor device includes a hybrid fin structure adjacent to a first side of the channel layers. The semiconductor device includes an oxide-filled barrier structure adjacent to a second side of the plurality of channel layers that is opposite the first side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a p-type metal-oxide semiconductor nanostructure transistor comprising:
   a first plurality of nanostructure channels over a semiconductor substrate,
      wherein the first plurality of nanostructure channels are arranged in a direction that is perpendicular to the semiconductor substrate, and
   a first gate structure wrapping around each of the first plurality of nanostructure channels;
an n-type metal-oxide semiconductor nanostructure transistor comprising:
   a second plurality of nanostructure channels over the semiconductor substrate,
      wherein the second plurality of nanostructure channels are arranged in the direction that is perpendicular to the semiconductor substrate, and
   a second gate structure wrapping around each of the second plurality of nanostructure channels;
a hybrid fin structure adjacent to a first side of the first gate structure,
   wherein a top surface of an isolation layer of the hybrid fin structure is planar, and
   wherein the hybrid fin structure comprises a high-k dielectric layer above the top surface of the isolation layer;
a shallow trench isolation (STI) region adjacent to a second side of the first gate structure and between the first plurality of nanostructure channels and the second plurality of nanostructure channels; and
an oxide-filled barrier structure over the STI region,
   wherein the oxide-filled barrier structure comprises a crystalline silicon-dioxide material lined with a dielectric material,
   wherein a top surface of the crystalline silicon-dioxide material comprises a tapered or concave shape, and
   wherein the oxide-filled barrier structure comprises a high-k dielectric layer, above the top surface of the crystalline silicon-dioxide material, that comprises a tapered or convex shaped surface.

2. The semiconductor device of claim 1, further comprising:
a metal layer comprising:
   a first portion adjacent to a first side of the high-k dielectric layer of the oxide-filled barrier structure and over the first gate structure, and
   a second portion adjacent to a second side of the high-k dielectric layer of the oxide-filled barrier structure and over the second gate structure.

3. The semiconductor device of claim 1, wherein the oxide-filled barrier structure comprises:
a depth extending below a bottom surface of the first gate structure,
   wherein the depth extending below the bottom surface of the first gate structure is included in a range of approximately 3 nanometers to approximately 20 nanometers.

4. The semiconductor device of claim 1, wherein the oxide-filled barrier structure comprises:
a width,
   wherein the width of the oxide-filled barrier structure is lesser relative to a width of a hybrid fin structure of the semiconductor device.

5. The semiconductor device of claim 1, wherein the oxide-filled barrier structure comprises:
a width,
   wherein the width is included in a range of approximately 7 nanometers to approximately 20 nanometers.

6. The semiconductor device of claim 1, wherein the dielectric material comprises:
one or more of a silicon dioxide material or a silicon oxycarbonnitride material.

7. The semiconductor device of claim 1, wherein the dielectric material comprises:
a surface that is a distance from a sidewall of a fin structure including the first plurality of nanostructure channels,
   wherein the distance is included in a range of approximately 3 nanometers to approximately 10 nanometers.

8. A method, comprising:
forming a plurality of nanostructure layers,
   wherein the plurality of nanostructure layers are formed over a semiconductor substrate and are arranged along a direction that is perpendicular to the semiconductor substrate;
forming a plurality of fin structures by etching the plurality of nanostructure layers,
   wherein a plurality of recesses are formed as a result of etching the plurality of nanostructure layers;
forming a shallow trench isolation (STI) region in the plurality of recesses;
forming layers of an oxide-filled barrier structure in a recess, of the plurality of recesses, that is adjacent to a first side of a fin structure of the plurality of fin structures,
   wherein a top surface of at least one layer, of the layers of the oxide-filled barrier structure, comprises a tapered or concave shaped surface,
   wherein a high-k dielectric layer of the oxide-filled barrier structure, formed above the top surface of the at least one layer, comprises a tapered or convex shaped surface, and
   wherein a layer of the oxide-filled barrier structure is in contact with a sidewall of the recess;

forming a cladding layer on a second side of the fin structure that is opposite the first side;

forming layers of a hybrid fin structure adjacent to the cladding layer, wherein an isolation layer of the hybrid fin structure comprises a planar surface, and wherein a high-k dielectric layer of the hybrid fin structure is formed above the planar surface;

removing the cladding layer, wherein removing the cladding layer includes removing a plurality of sacrificial layers between the plurality of nanostructure layers; and forming a layer of a gate structure that wraps around the plurality of nanostructure layers.

9. The method of claim 8, wherein forming the layers of the oxide-filled barrier structure includes:

forming a liner layer along a sidewall of the plurality of nanostructure layers; and forming an isolation layer over the liner layer.

10. The method of claim 9, wherein forming the liner layer includes:

forming the liner layer by depositing one or more layers of a silicon dioxide material or a silicon carbon oxy nitride material.

11. The method of claim 8, wherein the at least one layer, of the layers of the oxide-filled barrier structure, comprises a crystalline silicon-dioxide material.

12. The method of claim 8, wherein forming the layer of the gate structure includes:

forming the layer of the gate structure by depositing a $p^+$ work-function metal in cavities formed by the removing of the plurality of sacrificial layers.

13. The method of claim 8, wherein forming the layer of the gate structure includes:

forming the layer of the gate structure by depositing an $n^+$ work-function metal in cavities formed by the removing of the plurality of sacrificial layers.

14. The method of claim 8, further comprising:

removing portions of the layers of the oxide-filled barrier structure prior to removing the cladding layer, wherein removing the portions of the layers of the oxide-filled barrier structure form the tapered or concave shaped surface, and wherein the high-k dielectric layer of the oxide-filled barrier structure is formed over the tapered or concave shaped surface prior to removing the cladding layer.

15. A method, comprising:

forming a plurality of channel layers over a semiconductor substrate, wherein the plurality of channel layers are arranged in a direction that is perpendicular to the semiconductor substrate;

forming a gate structure wrapping around each of the plurality of channel layers;

forming a hybrid fin structure adjacent to a first side of the gate structure;

forming a shallow trench isolation (STI) region adjacent to a second side of the gate structure that is opposite the first side; and forming an oxide-filled barrier structure on the STI region, wherein a top surface of an isolation layer of the oxide-filled barrier structure comprises a tapered or concave shape, wherein a high-k dielectric layer of the oxide-filled barrier structure, formed above the top surface of the isolation layer of the oxide-filled barrier structure, comprises a tapered or convex shaped surface, wherein a top surface of an isolation layer of the hybrid fin structure is planar, and wherein a high-k dielectric layer of the hybrid fin structure is formed above the top surface of the isolation layer.

16. The method of claim 15, wherein the gate structure corresponds to a first gate structure adjacent to a first side of the oxide-filled barrier structure, and wherein the method further comprises:

forming a second gate structure adjacent to a second side of the oxide-filled barrier structure that is opposite the first side of the oxide-filled barrier structure.

17. The method of claim 16, wherein forming the first gate structure comprises:

forming a first work-function metal for a p-type metal oxide semiconductor (PMOS) transistor, and wherein forming the second gate structure comprises forming a second work-function metal for an n-type metal oxide semiconductor (NMOS) transistor.

18. The method of claim 16, further comprising:

forming a conductive layer over the first gate structure and over the second gate structure, wherein the conductive layer electrically connects the first gate structure and the second gate structure.

19. The method of claim 17, wherein the plurality of channel layers are a first plurality of channel layers on a first side of the oxide-filled barrier structure; and wherein the method further comprises:

forming a second plurality of channel layers on a second side of the oxide-filled barrier structure.

20. The method of claim 19, wherein the second work-function metal is formed to wrap around the second plurality of channel layers.

* * * * *